United States Patent
Sakui et al.

(10) Patent No.: US 11,437,349 B2
(45) Date of Patent: Sep. 6, 2022

(54) SEMICONDUCTOR DEVICE

(71) Applicants: HONDA MOTOR CO., LTD., Tokyo (JP); TOKYO INSTITUTE OF TECHNOLOGY, Tokyo (JP)

(72) Inventors: Koji Sakui, Wako (JP); Takayuki Ohba, Tokyo (JP)

(73) Assignees: HONDA MOTOR CO., LTD., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/147,658

(22) Filed: Jan. 13, 2021

(65) Prior Publication Data

US 2021/0225427 A1 Jul. 22, 2021

(30) Foreign Application Priority Data

Jan. 16, 2020 (JP) .............................. JP2020-005051

(51) Int. Cl.
*H01L 25/065* (2006.01)
*H01L 25/18* (2006.01)
(Continued)

(52) U.S. Cl.
CPC ............ *H01L 25/0657* (2013.01); *G11C 5/06* (2013.01); *G11C 11/4093* (2013.01);
(Continued)

(58) Field of Classification Search
CPC ... H01L 25/0657; H01L 23/481; H01L 25/18; H01L 2225/06541; H01L 2225/06527;
(Continued)

(56) References Cited

U.S. PATENT DOCUMENTS

2010/0200998 A1  8/2010  Furuta et al.
2016/0034371 A1  2/2016  Oh et al.
(Continued)

FOREIGN PATENT DOCUMENTS

JP      2000-100181     4/2000

OTHER PUBLICATIONS

Ex Parte Quayle Action for U.S. Appl. No. 17/147,633 mailed Dec. 21, 2021.

*Primary Examiner* — Tri M Hoang
(74) *Attorney, Agent, or Firm* — Amin, Turocy & Watson, LLP

(57) ABSTRACT

This semiconductor device includes a memory semiconductor chip having a plurality of memory cells, a planar buffer chip which is a semiconductor chip that comprises a plurality of buffer circuits which hold data read from the memory cell and data written to the memory cell and which output the held data in accordance with the number of bit lines of the plurality of memory cells, an electrical connection structure which electrically connects the bit lines of the memory cells of the memory semiconductor chip and the buffer circuits of the planar buffer chip to each other in a thickness direction of the memory semiconductor chip and the planar buffer chip, and a plurality of bit wiring layers provided in accordance with the respective buffer circuits and electrically connected to the bit lines of the buffer circuits. The bit wiring layers are laminated on the planar buffer chip.

5 Claims, 27 Drawing Sheets

(51) Int. Cl.
  *H01L 23/48*       (2006.01)
  *G11C 5/06*        (2006.01)
  *G11C 11/4093*     (2006.01)
  *G11C 11/4094*     (2006.01)
  *G11C 11/4097*     (2006.01)

(52) U.S. Cl.
  CPC ...... *G11C 11/4094* (2013.01); *G11C 11/4097* (2013.01); *H01L 23/481* (2013.01); *H01L 25/18* (2013.01); *H01L 2225/06541* (2013.01)

(58) Field of Classification Search
  CPC ............ H01L 2225/06565; G11C 5/06; G11C 11/4093; G11C 11/4094; G11C 11/4097; G11C 16/0483; G11C 16/08; G11C 7/106; G11C 7/1087; G11C 16/26; G11C 5/063
  See application file for complete search history.

(56) References Cited

U.S. PATENT DOCUMENTS

| | | |
|---|---|---|
| 2017/0040338 A1* | 2/2017 | Lee .................. H01L 27/11582 |
| 2017/0330624 A1 | 11/2017 | Lim et al. |
| 2017/0373084 A1 | 12/2017 | Shim et al. |
| 2019/0096776 A1 | 3/2019 | Nishioka |
| 2019/0189221 A1 | 6/2019 | Kim et al. |
| 2020/0303009 A1* | 9/2020 | Sakui .................. G11C 16/0483 |
| 2021/0036015 A1* | 2/2021 | Lim ........................ H01L 25/18 |
| 2021/0193623 A1 | 6/2021 | Oh et al. |
| 2021/0217760 A1 | 7/2021 | Yang et al. |

\* cited by examiner

SEMICONDUCTOR DEVICE

CROSS-REFERENCE TO RELATED APPLICATION

The present application claims priority based on Japanese Patent Application No. 2020-005051 filed Jan. 16, 2020, the content of which is incorporated herein by reference.

BACKGROUND

Field of the Invention

The present invention relates to a semiconductor device.

Description of Related Art

A semiconductor device such as a flash memory includes a page buffer circuit for parallel access for reading or writing of data in units of pages that are predetermined data lengths and access is allowed in units of pages (for example, refer to Japanese Unexamined Patent Application, First Publication No. 2000-100181).

SUMMARY

However, in such a semiconductor device in the related art described above, for example, a bit line of a memory cell and the page buffer circuit are connected to each other through a wiring on a flat surface of a semiconductor chip. Therefore, the data length that can be access in parallel is restricted by a wiring pitch on the flat surface. For this reason, in the semiconductor device in the related art, it is difficult to increase an access speed.

An object of an aspect of the present invention is to provide a semiconductor device capable of increasing an access speed.

An aspect of the present invention is a semiconductor device including: a memory semiconductor chip having a plurality of memory cells; a planar buffer chip which is a semiconductor chip that comprises a plurality of buffer circuits which hold data read from the memory cell and data written to the memory cell and which output the held data in accordance with the number of bit lines of the plurality of memory cells; an electrical connection structure which electrically connects the bit lines of the memory cells of the memory semiconductor chip and the buffer circuits of the planar buffer chip to each other in a thickness direction of the memory semiconductor chip and the planar buffer chip; and a plurality of bit wiring layers provided in accordance with the respective buffer circuits and electrically connected to the bit lines of the buffer circuits. The bit wiring layers are laminated on the planar buffer chip.

In the foregoing semiconductor device, on the planar buffer chip, the bit wiring layers respectively provided for the bit lines of the buffer circuits may be laminated through interlayer insulating layers.

The foregoing semiconductor device may further include a buffer decoder part which selectively connect one of the bit lines of a predetermined number of the memory cells with the buffer circuit.

In the foregoing semiconductor device, in the memory semiconductor chip, a plurality of semiconductor tips including the memory cells may be laminated in the thickness direction, and the electrical connection structure may electrically connects the laminated semiconductor tips with the planar buffer chip.

In the foregoing semiconductor device, the electrical connection structure may include a penetration electrode which penetrates the memory semiconductor chip and the planar buffer chip in the thickness direction and connects the memory semiconductor chip to the planar buffer chip using a conductor.

According to an aspect of the present invention, an access speed can be increased.

DESCRIPTION OF THE EMBODIMENTS

Hereinafter, a semiconductor device according to embodiments of the present invention will be described with reference to the drawings.

First Embodiment

Figure 1:
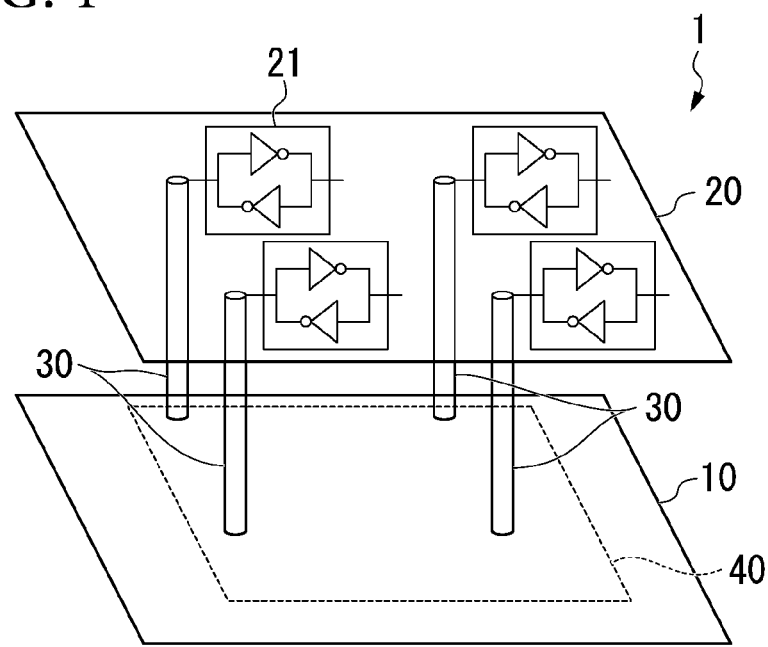
FIG. 1 is a configuration view showing an example of a semiconductor device according to a first embodiment.

FIG. 1 is a configuration view showing an example of a semiconductor device 1 according to a first embodiment.

As shown in FIG. 1, the semiconductor device 1 is, for example, a three-dimensional (3D) NAND-type flash memory device and includes a memory semiconductor chip 10, a planar buffer chip 20, and TSV (Through-Silicon Via) 30.

The memory semiconductor chip 10 is a semiconductor chip provided with a memory cell array 40 including a plurality of memory cells (NAND-type flash memory cells) MC. A detailed configuration of the memory cell array 40 will be described below.

The planar buffer chip 20 is a semiconductor chip provided with a plurality of buffer circuits 21 in accordance with the number of bit lines (reading lines) of the memory semiconductor chip 10. The buffer circuit 21 is a circuit holding data read from the memory cell MC and data written in the memory cell MC. The buffer circuit 21 outputs held data as readout data at the time of reading. The buffer circuit 21 outputs held data as write data to the memory cell MC at the time of writing.

The TSV 30 is a bumpless penetration electrode penetrating the memory semiconductor chip 10 and the planar buffer chip 20 in a thickness direction and that connects the memory semiconductor chip 10 to the planar buffer chip 20 using a conductor. The TSV 30 electrically connects the bit line of the memory cell MC and the buffer circuit 21 to each other in the thickness direction of the memory semiconductor chip 10 and the planar buffer chip 20.

Figure 2:
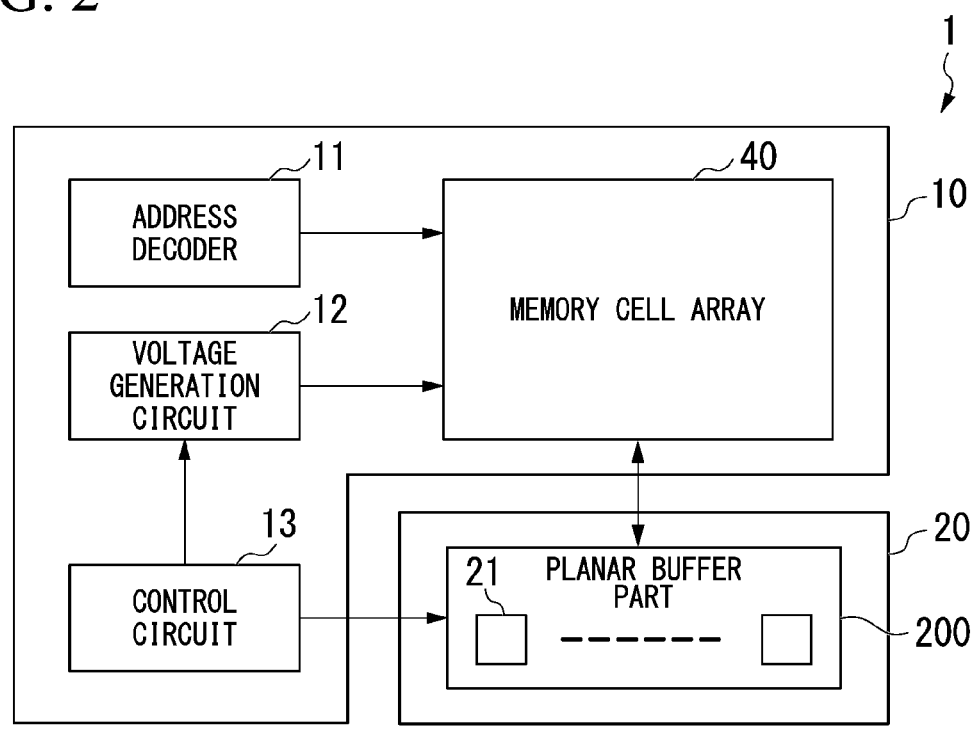
FIG. 2 is a functional block diagram showing an example of the semiconductor device according to the first embodiment.

FIG. 2 is a functional block diagram showing an example of the semiconductor device 1 according to the present embodiment. As shown in FIG. 2, the semiconductor device 1 includes an address decoder 11, a voltage generation circuit 12, a control circuit 13, a planar buffer part 200, and the memory cell array 40.

The address decoder 11 decodes input address information and outputs a control signal for selecting a memory cell MC of the memory cell array 40.

The voltage generation circuit 12 generates an erase voltage necessary for erasing data and a write voltage necessary for writing data and supplies the generated erase voltage and write voltage to the memory cell array 40 that is a flash memory.

The control circuit 13 is a logic circuit for controlling the semiconductor device 1 in response to an input from outside. The control circuit 13 controls, for example, reading data from the memory cell array 40, erasing data of the memory cell array 40, and writing data to the memory cell array 40.

In order to collectively read or write data of a predetermined data length (bit width), the planar buffer part 200 includes the buffer circuits 21 in accordance with the predetermined data length (bit width). In the present embodiment, data having a predetermined data length (bit width) is defined as "a page", and the planar buffer part 200 retains page data.

The buffer circuit 21 according to the present embodiment is connected to the bit line of the memory cell array 40 that is drawn out in the thickness direction through the TSV 30, and a plurality of buffer circuits 21 are arranged two-dimensionally on a planar shape on a plane of the planar buffer chip 20.

Next, with reference to FIGS. 3 to 6, a configuration of the memory cell array 40 according to the present embodiment will be described.

Figure 3:
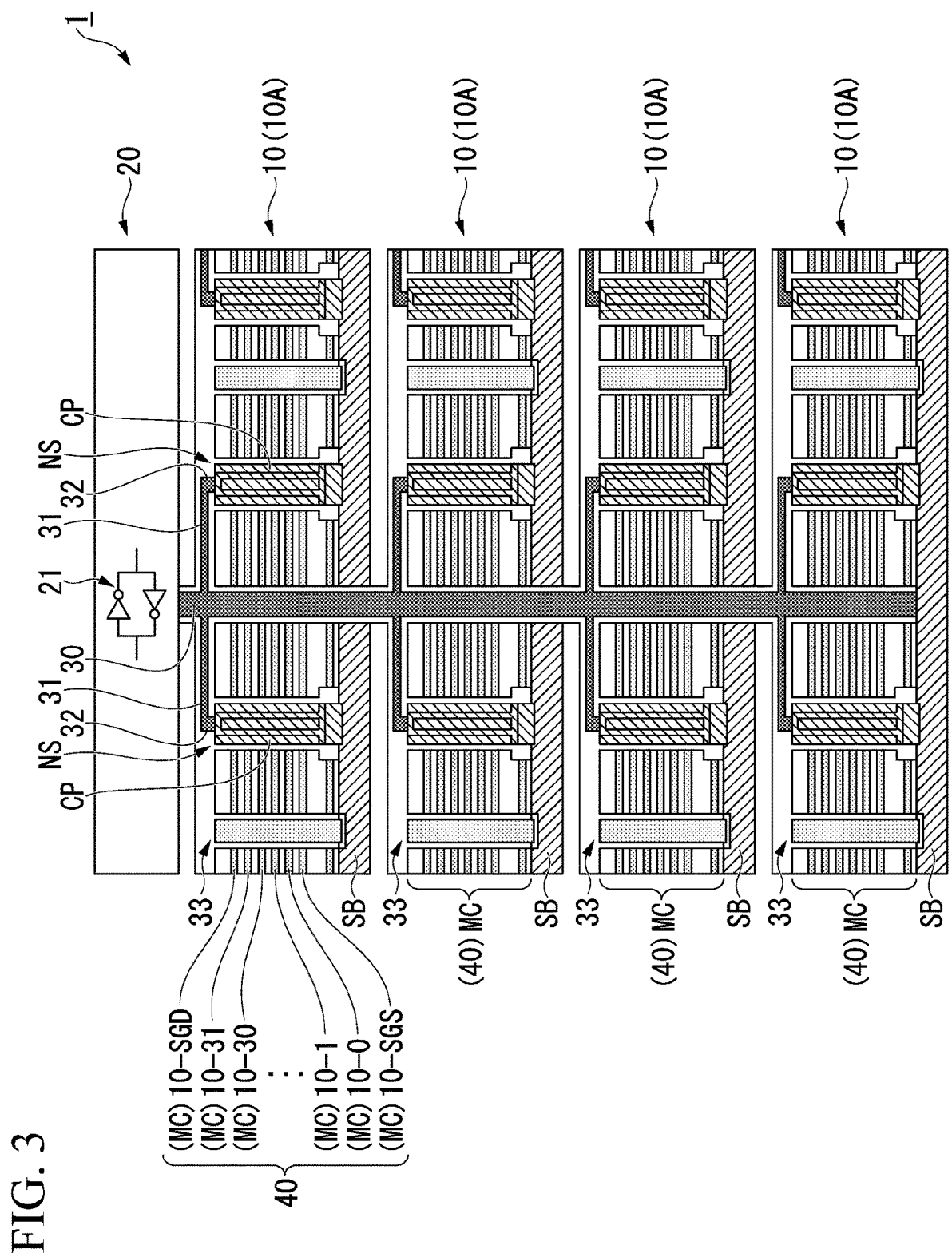
FIG. 3 is a cross-sectional view showing an example of a configuration of a memory cell array and a planar buffer chip according to the first embodiment.
Figure 4:
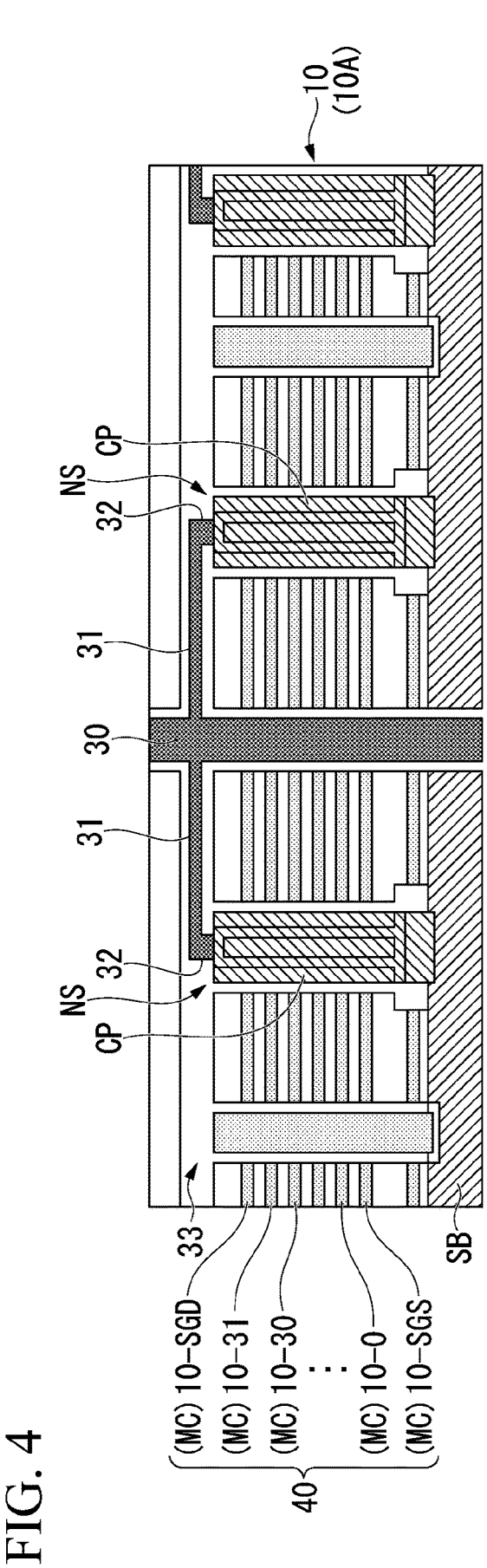
FIG. 4 is an enlarged cross-sectional view of a portion of the memory cell array shown in FIG. 3.
Figure 5:
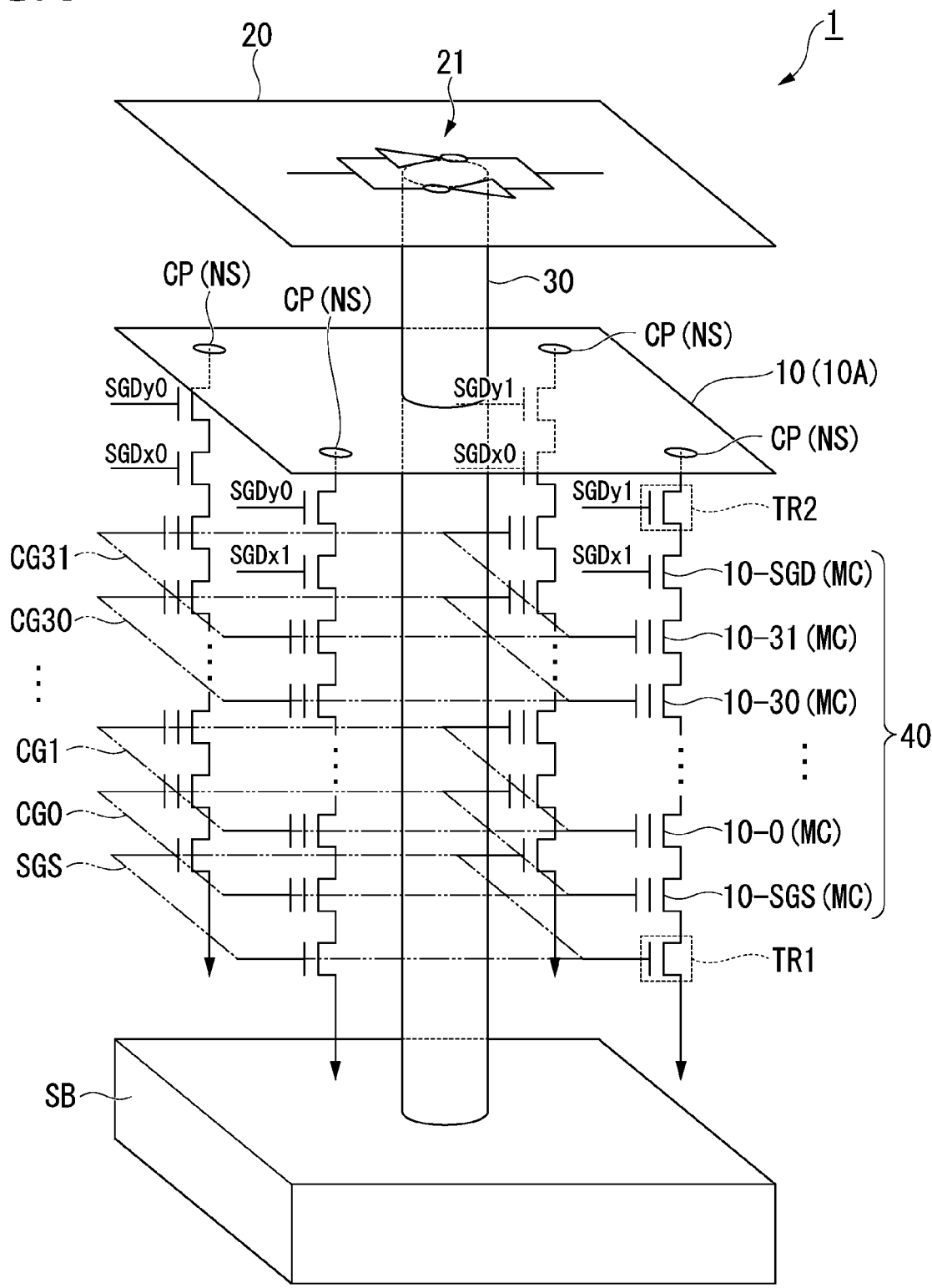
FIG. 5 is a configuration view showing an electrical connection structure of the memory cell array and the planar buffer chip according to the first embodiment.
Figure 6:
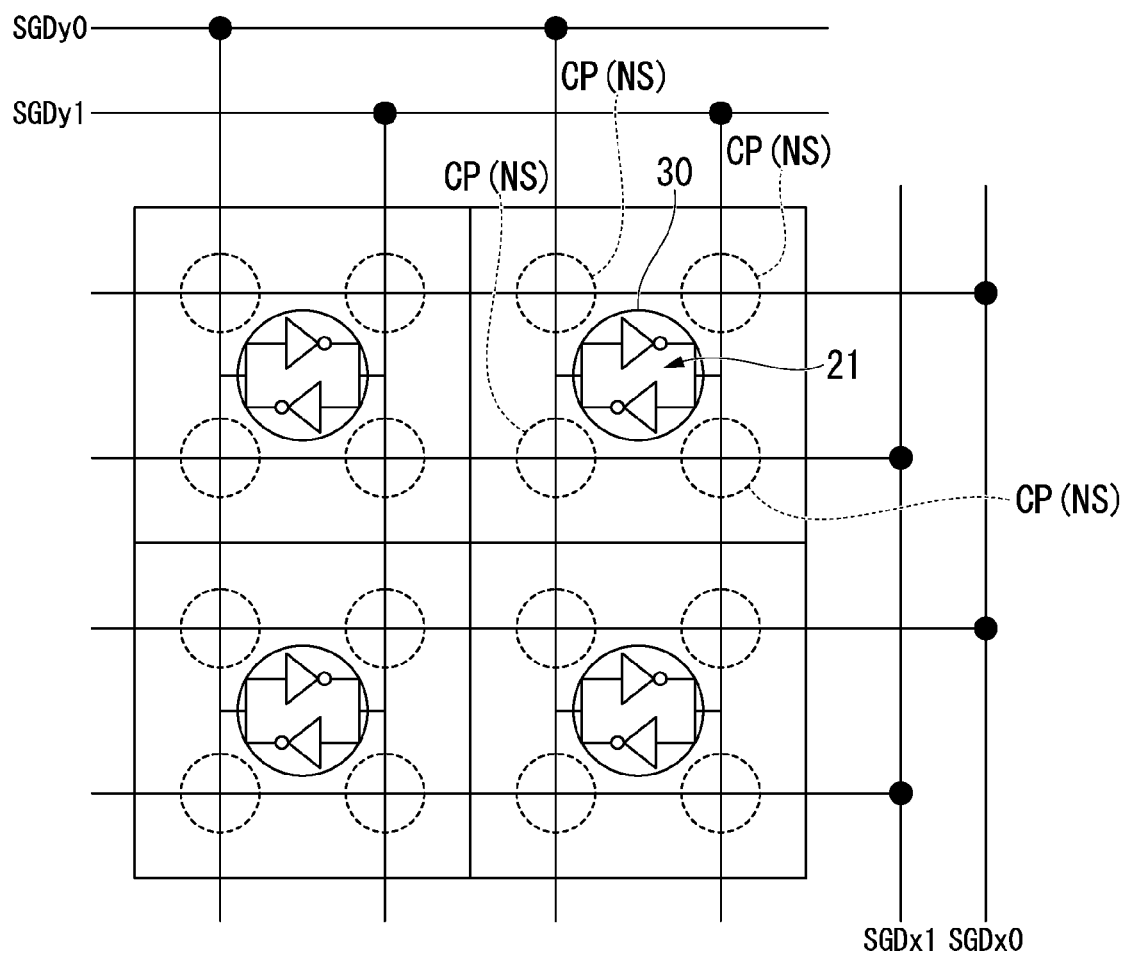
FIG. 6 is a plan view of a configuration of the electrical connection structure of the memory cell array and the planar buffer chip shown in FIG. 5.

FIG. 3 is a cross-sectional view showing an example of a configuration of the memory cell array 40 and the planar buffer chip 20. FIG. 4 is an enlarged cross-sectional view of a portion of the memory cell array 40 shown in FIG. 3. FIG. 5 is a configuration view showing an electrical connection structure of the memory cell array 40 and the planar buffer chip 20. FIG. 6 is a plan view of a configuration of the electrical connection structure of the memory cell array 40 and the planar buffer chip 20 shown in FIG. 5.

As shown in FIGS. 3 to 6, the memory cell array 40 includes a plurality of gate plate electrodes (10-SGS, 10-0, (ellipsis), 10-30, 10-31, and 10-SGD) laminated in the thickness direction (Z axis direction) of the memory semiconductor chip 10.

In addition, the memory cell array 40 includes a plurality of NAND cell strings NS in which the plurality of memory cells MC and selection transistors (TR1 and TR2) are connected in series. The plurality of NAND cell strings (NAND strings) NS are disposed in a matrix shape within a surface of the memory semiconductor chip 10.

In the NAND cell strings NS, for example, a grounding selection transistor TR1, 32 memory cells MC, and the data selection transistor TR2 are connected in series between a bit lines and a ground (GND) line.

The 32 memory cells MC are connected in series between the grounding selection transistor TR1 and the data selection transistor TR2. Cell gate signal lines (CG0 to CG31) are connected to each gate terminals, and the 32 memory cells MC are controlled in accordance with any signal of a CG0 signal to a CG31 signal.

The grounding selection transistor TR1 is an N-type metal-oxide-semiconductor field-effect transistor (NMOS transistor (N-type MOSFET)) disposed between the 32 memory cells MC and the GND line. An SGS signal line is connected to the gate terminal of the grounding selection transistor TR1, and the grounding selection transistor TR1 is controlled by SGS signals.

The data selection transistor TR2 is an NMOS transistor disposed between the bit lines and the 32 memory cells MC. Any of signal lines SGDx0, SGDx1, SGDy0, and SGDy1 is connected to the gate terminals of the data selection transistor TR2, and the data selection transistor TR2 is controlled by any signal of an SGDx0 signal, an SGDx1 signal, an SGDy0 signal, and an SGDy1 signal.

The SGDx0 signal, the SGDx1 signal, the SGDy0 signal, the SGDy1 signal, the SGS signal, and the CG0 signal to the CG31 signal are generated by the address decoder 11 and the control circuit 13 described above.

Each connection between the grounding selection transistor TR1, the 32 memory cells MC, and the data selection transistor TR2 is made in a thick direction (Z-axis direction) so as to penetrate through the plurality of gate plate electrodes (10-SGS, 10-0, (ellipsis), 10-30, 10-31, and 10-SGD) by cell pillars (penetration electrodes) CP which are penetration electrodes.

Next, with reference to the drawings, operation of the semiconductor device 1 according to the present embodiment will be described.

In FIG. 2 described above, in reading out data is from the semiconductor device 1, for example, a data readout command are input to the semiconductor device 1, first, the address decoder 11 generates the SGDx0 signal, the SGDx1 signal, the SGDy0 signal, the SGDy1 signal, the SGS signal, and the CG0 to CG31 signals for selecting a memory cell MC to be read out on the basis of the input address information.

Specifically, the address decoder 11 selects the NAND cell strings NS by setting any of the SGDx0 signal and the SGDx1 signal and any of the SGDy0 signal and the SGDy1 signal to a high state and setting other signals to a low state. In addition, the address decoder 11 selects one memory cell MC of the selected NAND cell strings NS by setting any one of the CG0 to CG31 signals to a low state and setting other signals to a high state.

From the selected memory cell MC, "0" or "1" can be read out depending on whether or not a current flows in an OFF state in which the gate terminal is in the low state. The data of "0" or "1" held by the memory cell MC is input to the buffer circuit 21 through the bit lines and the TSV 30 and is held by the buffer circuit 21. Here, data of a predetermined data length (bit width) is read out in parallel from the memory cell array 40 and retained in the planar buffer part 200.

In response to the data readout command, the control circuit 13 allows the planar buffer part 200 to hold readout data sequentially output held readout data to the outside.

In writing data in the semiconductor device 1, when address information, for example, a data writing command, and write data are input to the semiconductor device 1, the control circuit 13 allows the planar buffer part 200 to hold the write data. Then, the address decoder 11 generates the SGDx0 signal, the SGDx1 signal, the SGDy0 signal, the SGDy1 signal, the SGS signal, and the CG0 to CG31 signals for selecting a memory cell MC to be read on the basis of the input address information, and the control circuit 13 writes data of a predetermined data length (bit width) in parallel by applying a writing voltage to the memory cell array 40 from the voltage generation circuit 12.

Next, with reference to FIGS. 3 to 6, the electrical connection structure of a chip laminate 10A, in which a plurality of memory semiconductor chips 10 according to the present embodiment are laminated in the thickness direction, and the planar buffer chips 20 will be described.

As shown in FIGS. 3, 4, and 5, the semiconductor device 1 of the present embodiment has electrical connection structures in which the bit lines of the memory cells MC of the memory semiconductor chips 10 described above and the buffer circuit 21 of the planar buffer chips 20 are electrically connected to each other through the TSV 30 penetrating the memory semiconductor chips 10 and the planar buffer chip 20 in the thickness direction.

In addition, the semiconductor device 1 of the present embodiment includes the chip laminate 10A in which the plurality of memory semiconductor chips 10 having the plurality of memory cells MC laminated on a semiconductor substrate SB are laminated in the thickness direction.

The semiconductor substrate SB is provided with, for example, a decoder, a string driver, and the like. The plurality of memory cells MC are laminated on this semiconductor substrate SB and constitute the memory cell array 40 described above.

FIGS. 3 and 4 illustrate a state in which the plurality of memory semiconductor chips 10 and the planar buffer chips 20 are separated from each other. However, actually, the plurality of memory semiconductor chips 10 and the planar buffer chips 20 are in a state of being directly adhered to each other or in a state of being adhered to each other with an intermediate layer (adhesive layer or the like) interposed therebetween.

The chip laminate 10A has a bumpless structure in which the plurality of memory semiconductor chips 10 are electrically connected to each other through the TSV 30 without having a bump electrode disposed between the plurality of memory semiconductor chips 10.

In addition, each of the memory semiconductor chips 10 has a structure in which the bit lines of the plurality of memory cells MC are electrically connected in the thickness direction through the TSV 30. Among these, in the memory semiconductor chip 10 positioned in the lowermost layer, the TSV 30 is provided in a state of penetrating the plurality of memory cells MC in the thickness direction. On the other hand, in the remaining memory semiconductor chips 10 positioned in layers above this lowermost layer, the TSV 30 is provided in a state of penetrating the plurality of memory cells MC and the semiconductor substrate SB in the thickness direction.

As shown in FIGS. 3 to 6, the chip laminate 10A has a structure in which each of the cell pillars CP of the plurality of NAND cell strings NS disposed around the TSV 30 and the TSV 30 are electrically connected to each other through bit wiring layers 31 and contact plugs 32. That is, the plurality of NAND cell strings NS are disposed so as to surround TSV 30 in a plan view and is connected to the TSV 30 in parallel through the bit wiring layers 31 and the contact plugs 32.

The bit wiring layers 31 are, for example, part of the bit lines of the semiconductor chips 10. The bit wiring layers 31 are provided within interlayer insulating layers 33 laminated on the respective memory semiconductor chips 10 and electrically connected to the TSVs 30. The contact plug 32 electrically connects the bit wiring layer 31 and the cell pillar CP to each other in a state of penetrating the interlayer insulating layer 33 in the thickness direction. The bit wiring layer 31 may be directly connected to the cell pillar CP extending in the thickness direction without passing through the contact plug 32.

Next, with reference to FIGS. 7 to 9, a configuration of the planar buffer chip 20 according to the present embodiment will be described.

Figure 7:
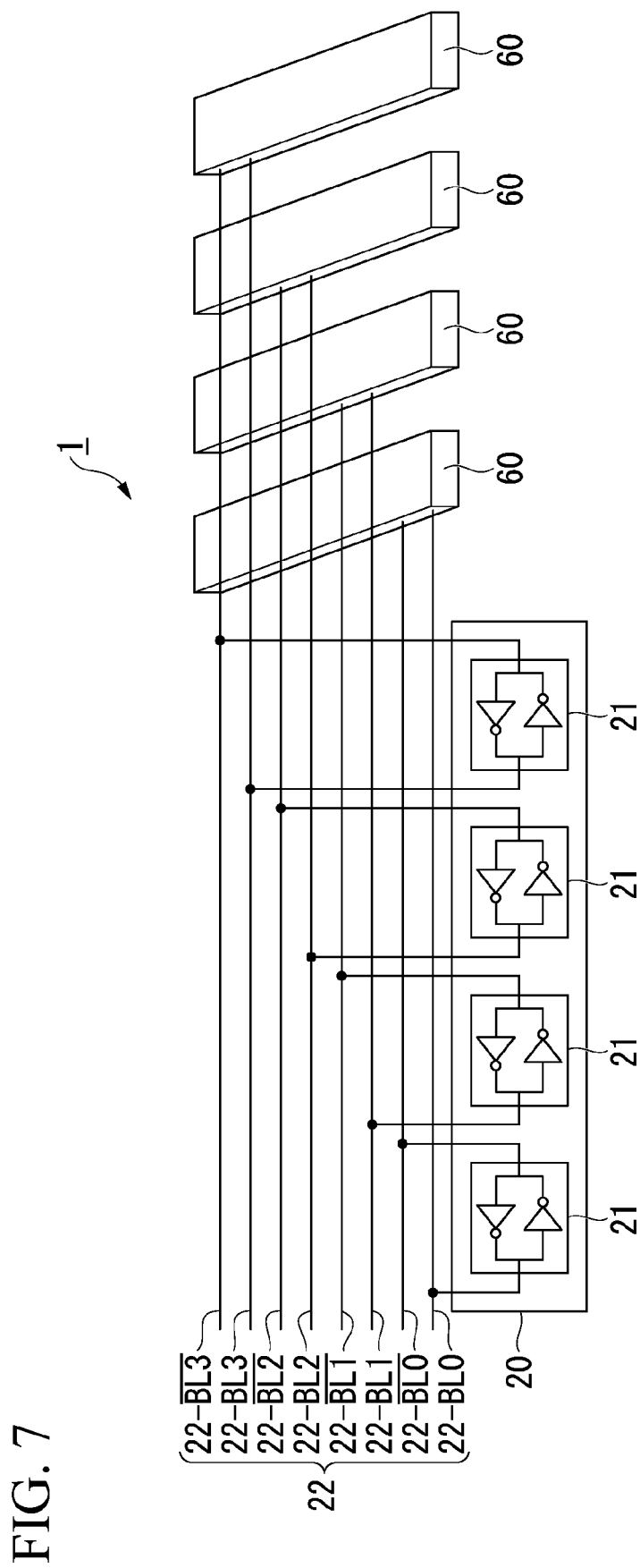
FIG. 7 is a configuration view showing an example of connection between buffer circuits included in the planar buffer chip according to the first embodiment and sense amplifiers.

FIG. 7 is a configuration view showing an example of connection between the buffer circuits 21 included in the planar buffer chip 20 and sense amplifiers 60 according to the present embodiment.

As shown in FIG. 7, the plurality of buffer circuits 21 included in the planar buffer chip 20 are electrically connected to the sense amplifiers 60 through a plurality of bit wiring layers 22 (22_BL0, 22_/BL0, 22_BL1, 22_/BL1, 22_BL2, 22_/BL2, 22_BL3, and 22_/BL3) provided for each pair of respective bit lines of the respective buffer circuits 21. The sense amplifiers 60 are provided in accordance with the respective buffer circuits 21 and detect and amplify data output from each of the buffer circuits 21. In FIG. 7, the semiconductor device 1 comprising four bit wiring layers 22 is shown as an example.

Figure 8:
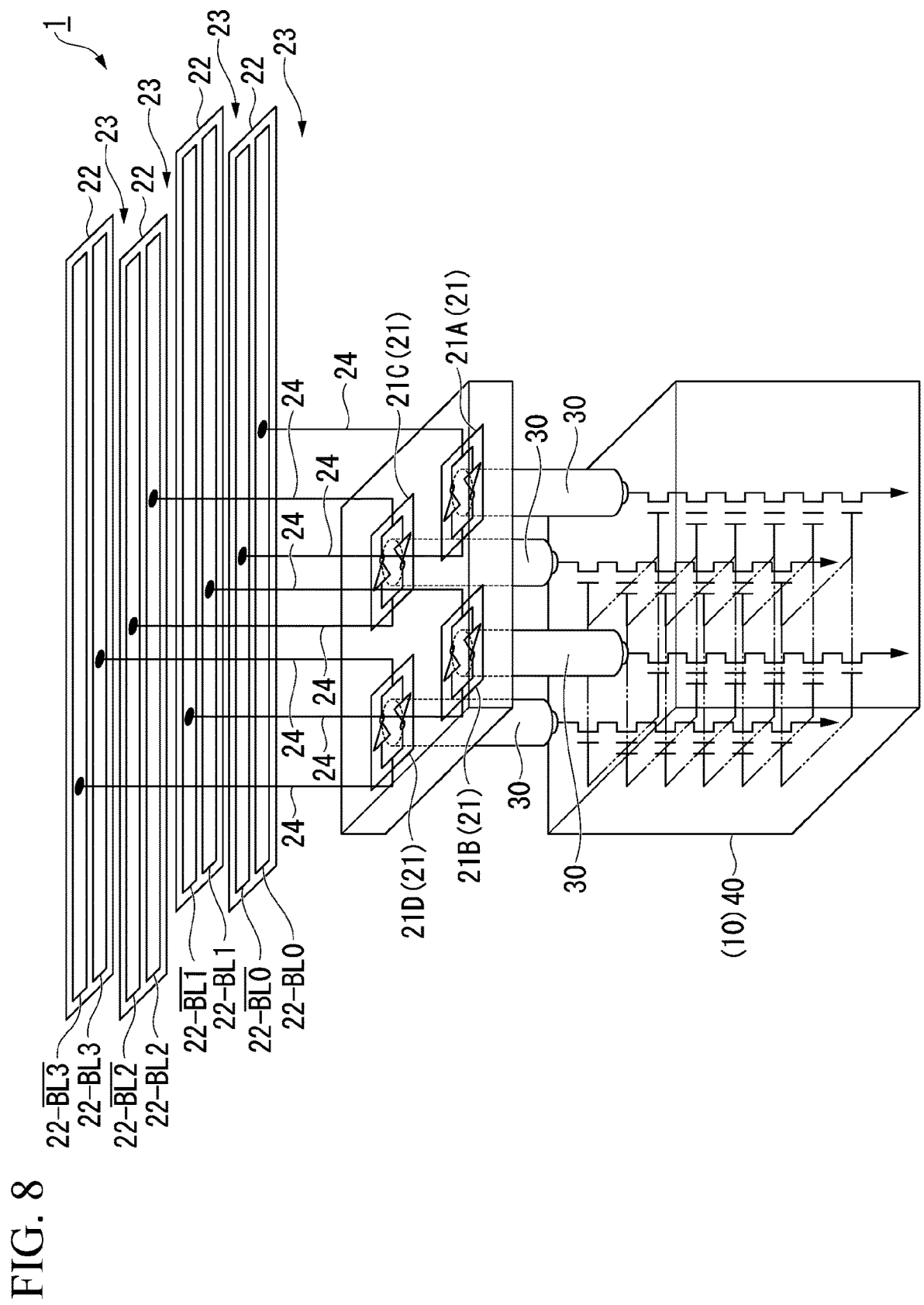
FIG. 8 is a view showing an example of a configuration of the semiconductor device in which four bit wiring layers are provided on the planar buffer chip according to the first embodiment.

In addition, FIG. 8 is a view showing an example of a configuration of the semiconductor device 1 in which four bit wiring layers 22 are provided on the planar buffer chip 20 according to the present embodiment.

As shown in FIG. 8, the buffer circuit 21 according to the present embodiment is connected so as to form the bit lines of the memory cell array 40 drawn out in the thickness direction through the TSV 30, and a plurality of buffer circuits 21 are arranged two-dimensionally on a plane of the planar buffer chip 20.

On the planar buffer chip 20, the bit wiring layers 22 provided for each pair of respective bit lines of the buffer circuits 21 are laminated and disposed through interlayer insulating layers 23. In addition, a pair of respective bit lines of the buffer circuits 21 and the bit wiring layers 22 corresponding to the respective buffer circuits 21 are electrically connected to each other through contact plugs 24 penetrating the interlayer insulating layers 23 in the thickness direction. In FIG. 8, the interlayer insulating layers 23 are shown as spaces.

FIG. 8 shows an example of a configuration in which four bit wiring layers 22 (22_BL0, 22_/BL0, 22_BL1, 22_/BL1, 22_BL2, 22_/BL2, 22_BL3, and 22_/BL3) are laminated and disposed on the planar buffer chip 20 with respect to the four buffer circuits 21 (which will hereinafter be distinguished as buffer circuits 21A, 21B, 21C, and 21D).

That is, the pair of bit wiring layers 22_BL0 and 22_/BL0 in the lowermost layer (first layer) and a pair of bit lines of the buffer circuit 21A are electrically connected to each other through the pair of contact plugs 24 penetrating the interlayer insulating layers 23 in the thickness direction.

In addition, the pair of bit wiring layers 22_BL1 and 22_/BL1 in a second layer and a pair of bit lines of the buffer circuit 21B are electrically connected to each other through the pair of contact plugs 24 penetrating the interlayer insulating layers 23 in the thickness direction.

In addition, the pair of bit wiring layers 22_BL2 and 22_/BL2 in a third layer and a pair of bit lines of the buffer circuit 21C are electrically connected to each other through the pair of contact plugs 24 penetrating the interlayer insulating layers 23 in the thickness direction.

In addition, the pair of bit wiring layers 22_BL3 and 22_/BL3 in the uppermost layer (fourth layer) and a pair of bit lines of the buffer circuit 21D are electrically connected to each other through the pair of contact plugs 24 penetrating the interlayer insulating layers 23 in the thickness direction.

Figure 9:
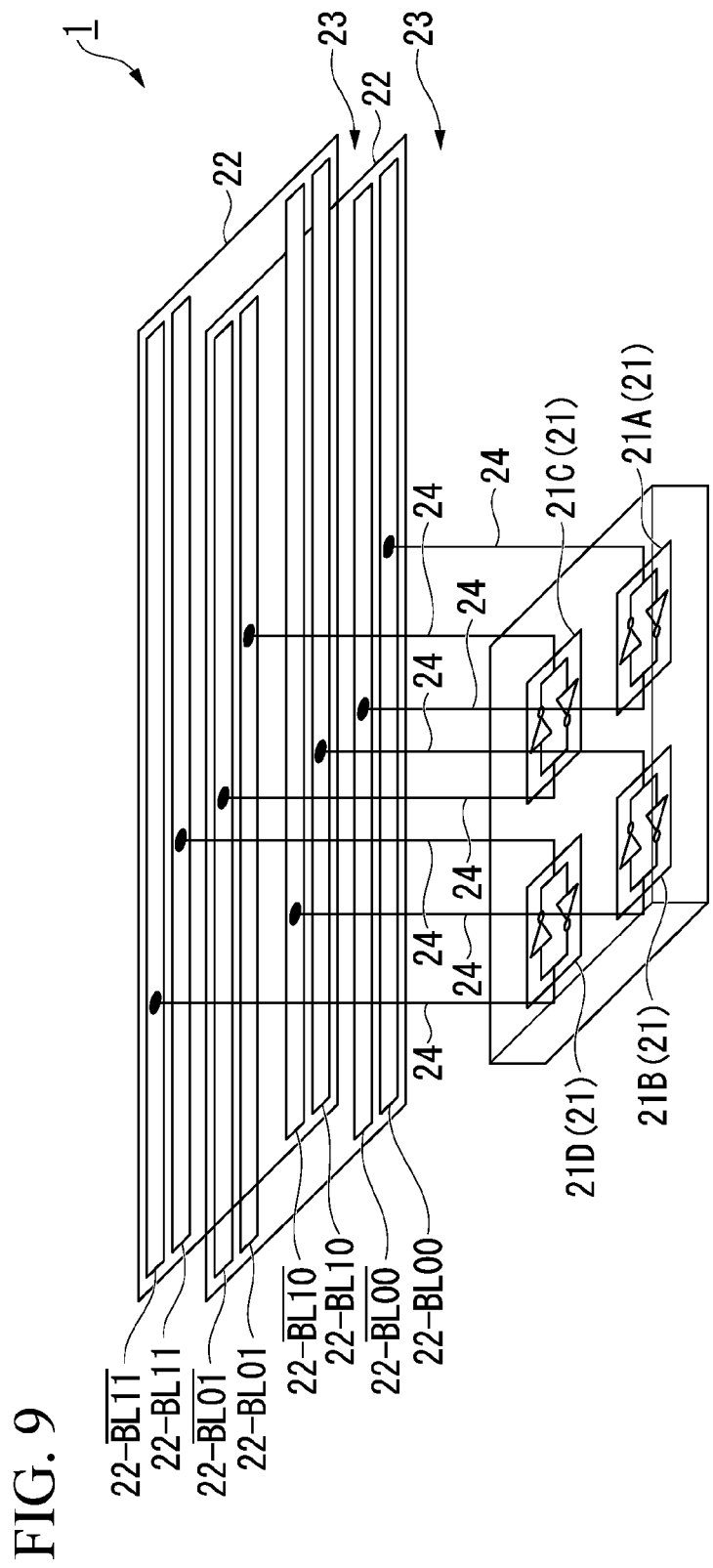
FIG. 9 is a view showing an example of a configuration in which two bit wiring layers are provided on the planar buffer chip according to the first embodiment.

FIG. 9 is a view showing an example of a configuration in which two bit wiring layers 22 are provided on the planar buffer chip 20 according to the present embodiment. In FIG. 9, the interlayer insulating layers 23 are shown as spaces.

FIG. 9 shows an example of a configuration in which two bit wiring layers 22 (22_BL00, 22_/BL00, 22_BL01, 22_/BL01, 22_BL10, 22_/BL10, 22_BL11, and 22_/BL11) are laminated and disposed on the planar buffer chip 20 with respect to the four buffer circuits 21 (21A, 21B, 21C, and 21D).

That is, the pair of bit wiring layers 22_BL00 and 22_/BL00 in the lowermost layer (first layer) and the pair of bit lines of the buffer circuit 21A are electrically connected to each other through the pair of contact plugs 24 penetrating the interlayer insulating layers 23 in the thickness direction.

In addition, the pair of bit wiring layers 22_BL01 and 22_/BL01 which are positioned in the same layer (first layer) as the pair of bit wiring layers 22_BL00 and 22_/BL00 and the pair of bit lines of the buffer circuit 21C are electrically connected to each other through the pair of contact plugs 24 penetrating the interlayer insulating layers 23 in the thickness direction.

In addition, the pair of bit wiring layers 22_BL10 and 22_/BL10 in the uppermost layer (second layer) and the pair of bit lines of the buffer circuit 21B are electrically connected to each other through the pair of contact plugs 24 penetrating the interlayer insulating layers 23 in the thickness direction.

In addition, the pair of bit wiring layers 22_BL11 and 22_/BL11 positioned in the same layer (second layer) as the pair of bit wiring layers 22_BL10 and 22_/BL10 and the pair of bit lines of the buffer circuit 21D are electrically connected to each other through the pair of contact plugs 24 penetrating the interlayer insulating layers 23 in the thickness direction.

In the semiconductor device 1 of the present embodiment, data can be accessed in (be read and written in) the plurality of buffer circuits 21 of the planar buffer chip 20 through the plurality of bit wiring layers 22 at the same time. Therefore, in the semiconductor device 1 according to the present embodiment, an access speed can be increased.

In addition, in the semiconductor device 1 of the present embodiment, there is no need to extremely minify design rules with respect to respective bit wiring layers 22 by laminating and disposing a plurality of bit wiring layers 22 on the planar buffer chip 20.

The present embodiment is not limited to a configuration in which two or four bit wiring layers 22 are disposed as described above, and the number of laminated bit wiring layers 22 can be suitably changed. For example, a configuration in which eight bit wiring layers 22 are disposed on the planar buffer chip 20 can be adopted. In addition, the number of bit wiring layers 22 disposed in each layer can also be suitably changed in accordance with the number of plurality of buffer circuits 21 disposed on the planar buffer chip 20.

As described above, the semiconductor device 1 according to the present embodiment includes the memory semiconductor chip 10 and the TSVs 30 (electrical connection structure). The memory semiconductor chip 10 includes the plurality of memory cells MC. The planar buffer chip 20 is the semiconductor chip that comprises a plurality of the buffer circuits in accordance with the number of the memory cells MC. The buffer circuits 21 are circuits that hold data read from the memory cells MC and data written in the memory cells MC. The TSV 30 electrically connects the bit lines of the memory cells MC of the memory semiconductor chip 10 and the buffer circuit 21 of the planar buffer chip 20 to each other in the thickness direction of the memory semiconductor chip 10 and the planar buffer chip 20. In addition, the plurality of bit wiring layers 22 electrically connected to the respective bit lines of the buffer circuits 21 are laminated and disposed on the planar buffer chip 20.

Accordingly, in the semiconductor device 1 according to the present embodiment, since the buffer circuits 21 can be arranged on the planar buffer chip 20 in a two-dimensional planar shape (for example, an XY plane shape), it is possible to have parallel access (reading and writing) to more memory cells MC. Hence, in the semiconductor device 1 according to the present embodiment, the access speed can be increased.

Conventionally, for example, one-dimensional line access has been provided in a technology in the related art, but in the semiconductor device 1 according to the present embodiment, by having two-dimensional surface access, the access speed can be improved by one digit or two digits. For example, in the technology in the related art, since 16 kilobytes (KB) for one page are written in 1 millisecond (ms), a throughput thereof is 16 MB/s. In contrast, in the semiconductor device 1 according to the present embodiment, for example, parallel processing for ten pages (160 KB) can be performed, and thus the speed of throughput can be increased to 160 MB/s.

In addition, in the semiconductor device 1 according to the present embodiment, the bit lines of the memory cells MC and the buffer circuits 21 of the planar buffer chips 20 are electrically connected to each other in the thickness direction (Z axis direction) in a three-dimensional manner. Therefore, for example, as in the technology in the related art, there is no need to have connection through the wirings on the flat surfaces of the semiconductor chips, and routing of the wirings is not restricted by a wiring pitch on the flat surface. Thus, in the semiconductor device 1 according to the present embodiment, the chip sizes of the memory semiconductor chips 10 can be reduced.

In addition, in the present embodiment, the plurality of gate plate electrodes (10-SGS, 10-0, (ellipsis), 10-30, 10-31, and 10-SGD) including the memory cells MC are laminated in the thickness direction in the memory semiconductor chips 10. The TSV 30 electrically connects the plurality of laminated gate plate electrodes (10-SGS, 10-0, (ellipsis), 10-30, 10-31, and 10-SGD) and the planar buffer chip 20 to each other. Accordingly, the semiconductor device 1 according to the present embodiment has a memory semiconductor chip 10 (memory cell arrays 40) defined in a three-dimensional manner. Therefore, the chip size of the memory semiconductor chip 10 can be further reduced, and the access speed can be further increased.

In addition, in the present embodiment, the TSV 30 is a penetration electrode penetrating the memory semiconductor chip 10 and the planar buffer chip 20 in the thickness direction and connecting the memory semiconductor chip 10 and the planar buffer chip 20 through a conductor. That is, the TSV 30 is a bumpless penetration electrode.

Accordingly, in the semiconductor device 1 according to the present embodiment, for example, compared to a case of using bumps in the technology in the related art, the pitch of the TSVs 30 can be extremely reduced, and more buffer circuits 21 can be disposed in the planar buffer chips 20. Thus, in the semiconductor device 1 according to the present embodiment, the chip sizes can be further reduced, and the access speed can be further increased.

In addition, compared to bumps in the technology in the related art, since the TSV 30 allows the semiconductor chip to be thinned, an impedance of connection can be reduced. For this reason, in the semiconductor device 1 according to the present embodiment, noise can be reduced and the access speed can be further increased.

In addition, the semiconductor device 1 according to the present embodiment has an electrical connection structure in which the bit lines of the plurality of memory cells MC are electrically connected in the thickness direction through the TSV 30 penetrating at least the plurality of memory cells MC in the thickness direction.

Accordingly, even when the number of plurality of memory cells MC electrically connected in the thickness direction is increased for each of the NAND cell strings NS of the memory semiconductor chips 10, reliability of electrical connection between the plurality of memory cells MC can be ensured.

Moreover, the semiconductor device 1 according to the present embodiment has an electrical connection structure in which the memory semiconductor chips 10 are electrically connected to each other through the TSV 30 in the chip laminate 10A in which the plurality of memory semiconductor chips 10 having the plurality of memory cells MC laminated on the semiconductor substrate SB are laminated in the thickness direction.

Accordingly, the number of plurality of memory cells MC electrically connected in the thickness direction of the chip laminate 10A can be increased. In addition, even when there is restriction (limitation) on the number of plurality of memory cells MC electrically connected in the thickness direction for each of the NAND cell strings NS of the memory semiconductor chips 10, reliability of electrical connection between the plurality of memory cells MC laminated in the thickness direction can be ensured for each of the NAND cell strings NS of the memory semiconductor chips 10.

Incidentally, for example, in a deep hole processing step of a 3D NAND flash memory device, there is limitation on an aspect ratio (a depth of a hole to a diameter of the hole) of a deep hole, and the number of laminated gate plate electrodes which can be penetrated at one time is 64 layers. For this reason, when the number of laminated gate plate electrodes is 128 layers, there is a need to repeat a lamination step for laminating 64 layers of the gate plate electrodes and a deep hole step twice. Moreover, when the number of laminated gate plate electrodes is 256 layers, there is a need to repeat the lamination step for laminating 64 layers of the gate plate electrodes and the deep hole step four times.

In addition, in the lamination step for laminating 64 layers of the gate plate electrodes, a heating step is added in processing of forming a tunnel oxide film or the like. Therefore, diffusion of source/drain of a transistor constituting a peripheral micro-circuit progresses due to the influence of heat. As a result, not only the transistor characteristics become dull but also there is a need to lengthen the distance of the source/drain. Therefore, it is difficult to produce a high-performance micro-transistor. Moreover, regarding the influence of such a heating step on transistors of peripheral circuits, they come under an equivalent influence when peripheral circuits are disposed next to a memory array in a CMOS Next Array (CNA) or when peripheral circuits are disposed immediately below a memory array in a CMOS Under Array (CUA).

On the other hand, when the number of plurality of memory cells electrically connected in the thickness direction is increased, a reading current of the memory cells significantly decreases as the resistance increases due to series connection of the memory cells, and a speed of random page access is reduced. As a result, this causes a problem that it takes time for cueing of data reading. In this case, since the number of memory cells in series connection becomes twice or four times from an application side, a size of an erasing block also becomes twice or four times.

Moreover, in a NAND flash memory, when new data is rewritten (overwritten), in order to protect data which has already been written and is not to be changed, there is a need to copy (moving work) data to a block which has already been erased. In this case as well, the number of memory cells in series connection becomes twice or four times, and thus moving work of data becomes twice or four times.

In order to avoid these problems, a method in which bit lines and source lines are interposed at certain intervals between gate plate electrodes laminated in the thickness direction can be considered. For example, while having 64 layers or 128 layers in one NAND memory cell series (NAND string unit), bit lines and source lines are provided in each NAND memory cell series. However, in this case as well, a new problem occurs. This is because different bit lines are consequently laminated in a perpendicular direction (thickness direction) in a planar layout of a memory cell array, and thus it is difficult to arrange the layout thereof.

In contrast, in the semiconductor device 1 according to the present embodiment, such a problem can be resolved by employing an electrical connection structure using the TSV 30 described above. That is, a plurality of memory semiconductor chips 10 having 64 layers of the gate plate electrodes are produced, and the chip laminate 10A in which the plurality of memory semiconductor chips 10 are laminated in the thickness direction is produced. Thereafter, the TSV 30 penetrating the plurality of memory semiconductor chips 10 in the thickness direction are formed.

Accordingly, in one memory semiconductor chip, there is no need to repeat the lamination step for laminating 64 layers of the gate plate electrodes and the deep hole step described above, and thus the influence of heat on transistors of peripheral circuits due to the heating step can also be avoided. In addition, since increase in resistance due to series connection of the plurality of memory cells MC can also be curbed using the TSV 30 penetrating the chip laminate 10A in the thickness direction, it is also possible to avoid reduction of the speed of random page access or delay of moving work of data. Moreover, the number of memory cells MC electrically connected to the thickness direction can be increased.

In addition, the semiconductor device 1 according to the present embodiment has an electrical connection structure in which each of the cell pillars CP of the plurality of NAND cell strings NS disposed around the TSV 30 and the TSV 30 are electrically connected to each other.

Accordingly, a capacity thereof can be further increased by increasing the number of NAND cell strings NS connected in parallel through the TSV 30.

Incidentally, signal lines SGy0 and SGy1 are orthogonal to other signal lines SGx0 and SGx1 or the gate plate electrodes (10-SGS, 10-0, (ellipsis), 10-30, 10-31, and 10-SGD). The signal lines SGx0 and SGx1 or the gate plate electrodes (10-SGS, 10-0, (ellipsis), 10-30, 10-31, and 10-SGD) are produced in a damascene process in which a dummy layer of SiN is removed and is replaced with tungsten (W). On the other hand, the signal lines SGy0 and SGy1 are produced by performing processing of reactive ion etching (RIE) after depositing tungsten (W).

The thickness of deposited tungsten (W) can be adjusted during a process. For example, compared to the thickness of 20 nm of the signal lines SGx0 and SGx1 or the gate plate electrodes (10-SGS, 10-0, (ellipsis), 10-30, 10-31, and 10-SGD) in a different damascene process, a withstand voltage is raised by setting the thickness to 130 nm which is thick. Accordingly, since a high voltage is applied to the NAND cell strings NS at the time of rewriting, a punch-through phenomenon is prevented from occurring on a side in contact with the bit lines.

In addition, at the time of writing, write inhibition NAND cell strings NS are boosted to approximately 10 V. For this reason, the signal lines SGy0 and SGy1 are completely cut off in order to prevent leakage of an electric charge from flowing from the NAND cell strings NS to the bit lines side and prevent a writing error from occurring.

On the other hand, at the time of erasing, the NAND cell strings NS are boosted to approximately 20 V. At this time, the signal lines SGy0 and SGy1 play a role as buffer transistors for preventing a punch-through from occurring on the bit lines side.

In addition, circuits such as a high-withstand voltage string driver, a row decoder, and the like are produced on the semiconductor substrate SB. These make an embodiment of the present invention effective in both cases in a CUA which is provided immediately below the memory cell array 40 and in a CAN which is not provided immediately below the same.

In addition, in the semiconductor substrate SB, bulk erasing of applying 20 V to the semiconductor substrate SB at the time of erasing using p-type silicon in which single crystal and a bottom part of the NAND cell strings NS are subjected to epitaxial growth may be used. In addition, a CUA may be provided immediately below the NAND cell strings NS, and the NAND cell strings NS may be produced on a polysilicon substrate.

In this case, gate induced drain leakage (GIDL) erasing may be used. In GIDL erasing, when the NAND cell strings NS are boosted at the time of erasing, a source voltage of the NAND cell strings NS is raised higher by several V than a voltage of a selection gate on the source side of the NAND cell strings NS and gradually boosted to approximately 20 V. Therefore, a GIDL current is generated, and the NAND cell strings NS are boosted to 20 V necessary for erasing.

Second Embodiment

Next, with reference to the drawings, a semiconductor device 1a according to a second embodiment will be described.

Figure 10:
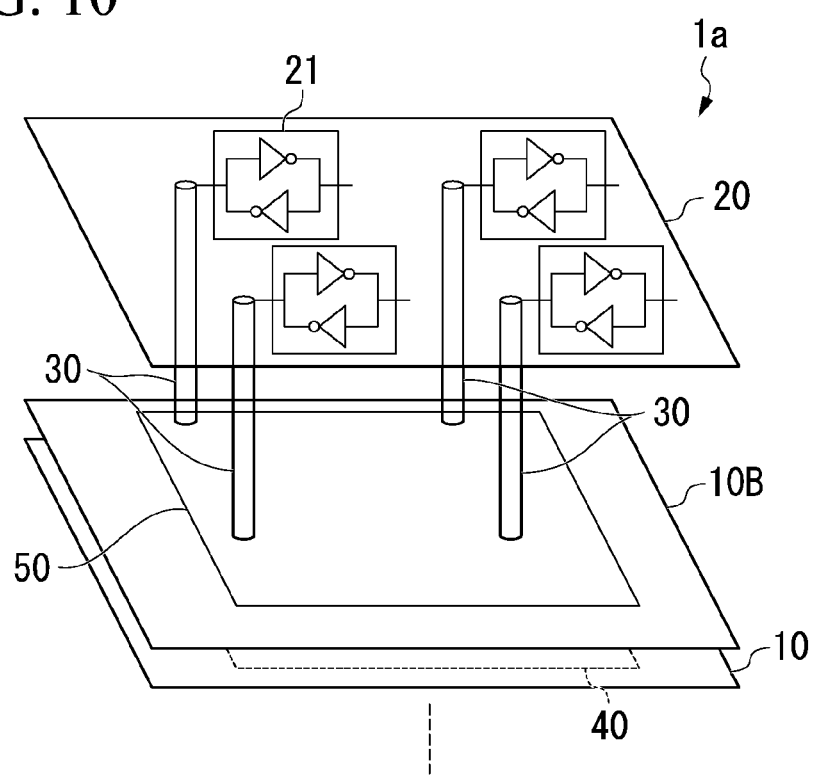
FIG. 10 is a configuration view showing an example of a semiconductor device according to a second embodiment.

FIG. 10 is a configuration view showing an example of the semiconductor device 1a according to the second embodiment.

As shown in FIG. 10, the semiconductor device 1a is NAND-type flash memory device, for example, and includes the memory semiconductor chip 10, a decoder 10B, the planar buffer chip 20, and the TSV 30. In FIG. 10, the same reference signs are applied to the same constituents as those in FIG. 1 described above, and description thereof will be omitted.

The decoder 10B includes a buffer decoder part 50 for selecting one buffer circuit 21 from bit lines of a predetermined number of memory cells. In the present embodiment, the memory semiconductor chip 10 and the planar buffer chip 20 are connected to each other through the TSV 30 via the decoder 10B. The decoder 10B is disposed inside the memory semiconductor chip 10.

Figure 11:
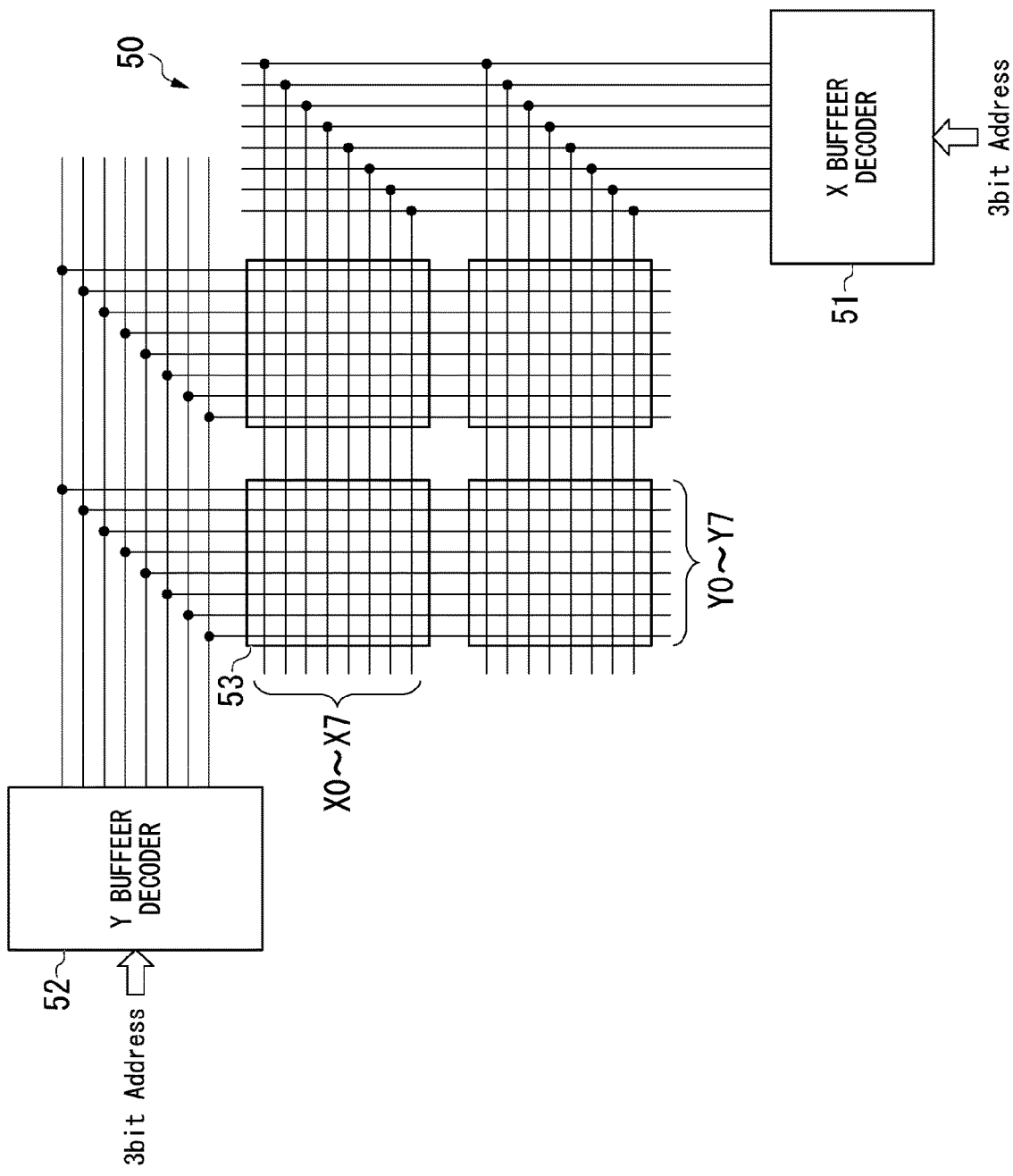
FIG. 11 is a configuration view showing an example of a buffer decoder part according to the second embodiment.

Next, with reference to FIGS. 11 to 13, a configuration of the buffer decoder part 50 will be described. FIG. 11 is a configuration view showing an example of the buffer decoder part 50 according to the present embodiment. As shown in FIG. 11, the buffer decoder part 50 includes an X buffer decoder 51, a Y buffer decoder 52, and a decoder switch part 53.

The X buffer decoder 51 generates selection signals X0 to X7 by decoding three bits of address information.

The Y buffer decoder 52 generates selection signals Y0 to Y7 by decoding three bits of address information different from the address information of the X buffer decoder 51.

The decoder switch part 53 selects one of 64 bit lines and connects it to the buffer circuits 21 using a combination of the selection signals X0 to X7 generated by the X buffer decoder 51 and the selection signals Y0 to Y7 generated by the Y buffer decoder 52.

In the present embodiment, one buffer circuit 21 is connected to one decoder switch part 53 through the TSV 30. In addition, one NAND cell string NS is connected to each of the 64 bit lines.

Next, with reference to FIGS. 12 and 13, a configuration of the decoder switch part 53 will be described.

Figure 12:
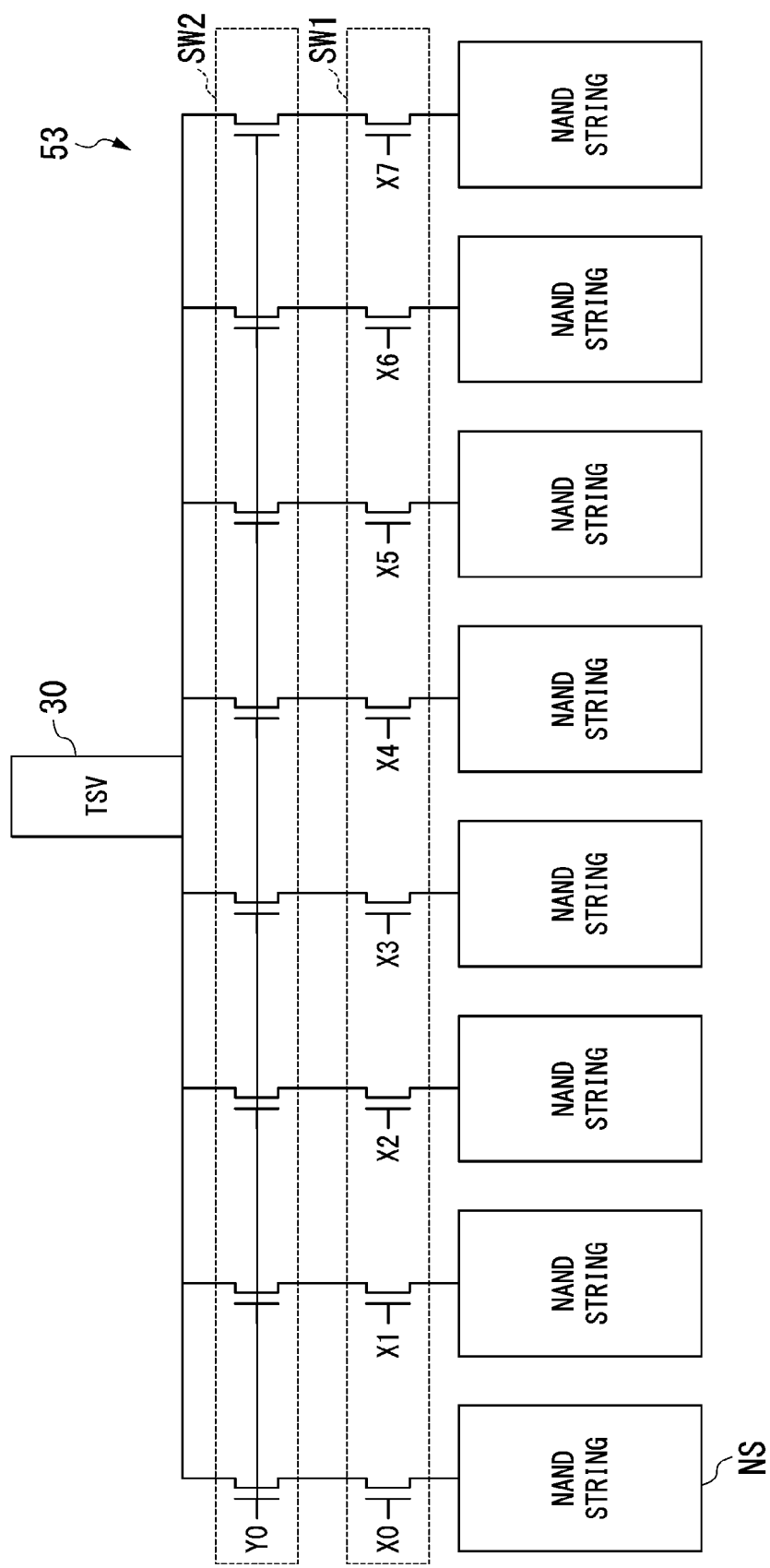
FIG. 12 is a view of a configuration of a case in which a Y0 line of a decoder switch part is selected in the second embodiment.

FIG. 12 is a view of a configuration of a case in which a Y0 line of the decoder switch part 53 according to the present embodiment is selected. In addition, FIG. 13 is a view of a configuration of a case in which an X0 line of the decoder switch part 53 according to the present embodiment is selected.

Figure 13:
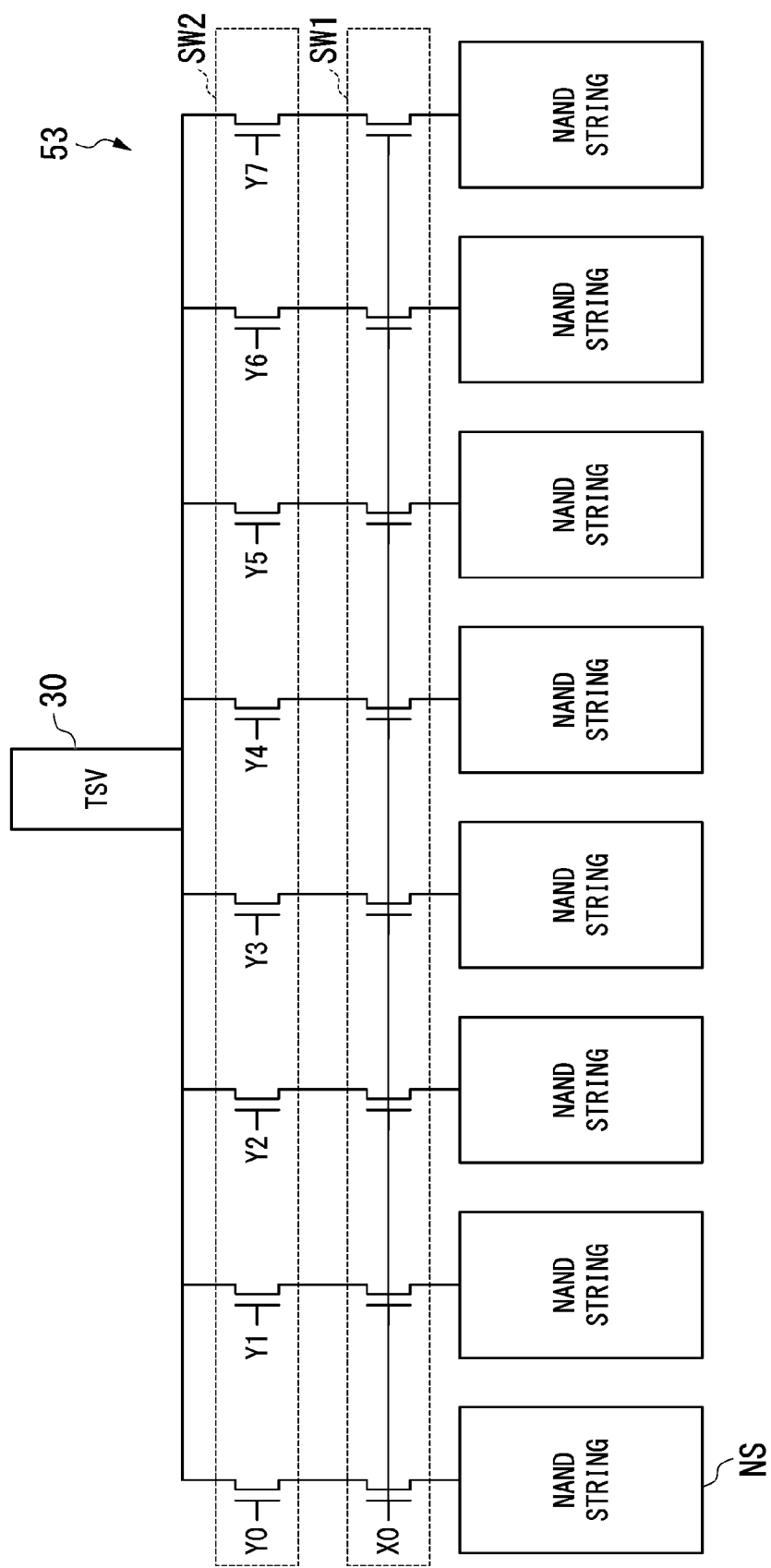
FIG. 13 is a view of a configuration of a case in which an X0 line of the decoder switch part is selected in the second embodiment.

As shown in FIGS. 12 and 13, the decoder switch part 53 includes a selection switch part SW1 and a selection switch part SW2.

The selection switch part SW1 is a selection switch controlled in accordance with the selection signals X0 to X7 generated by the X buffer decoder 51. In addition, the selection switch part SW2 is a selection switch controlled in accordance with the selection signals Y0 to Y7 generated by the Y buffer decoder 52.

The decoder switch part 53 selects one of the 64 NAND cell strings NS using a matrix of the selection switch part SW1 and the selection switch part SW2 and connects it to the buffer circuit 21 through the TSV 30.

The decoder switch part 53 and each of the NAND cell strings NS are electrically connected to each other using polysilicon or the like similar to that inside the NAND cell strings NS. In addition, the selection switch part SW1 and the selection switch part SW2 are disposed on the decoder 10B.

As described above, the semiconductor device 1a according to the present embodiment includes the memory semiconductor chip 10, the planar buffer chip 20, and the TSV 30 (electrical connection structure) described above and also includes the buffer decoder part 50. The buffer decoder part 50 selects one of a predetermined number (for example, 64) of bit lines of the memory cell and connects it to the buffer circuit 21.

Accordingly, the semiconductor device 1a according to the present embodiment can select one from the appropriate number of bit lines and connect the selected one bit line to the buffer circuit 21.

In the semiconductor device 1a according to the present embodiment, although illustration is omitted, similar to the foregoing semiconductor device 1, an electrical connection structure using the TSV 30 described above can be employed. In addition, similar to the foregoing semiconductor device 1, the plurality of bit wiring layers 22 electrically connected to the respective bit lines of the buffer circuits 21 can be laminated and disposed on the planar buffer chip 20.

The present invention is not limited to each of the foregoing embodiments and can be changed within a range not departing from the gist of the present invention.

Figure 14:
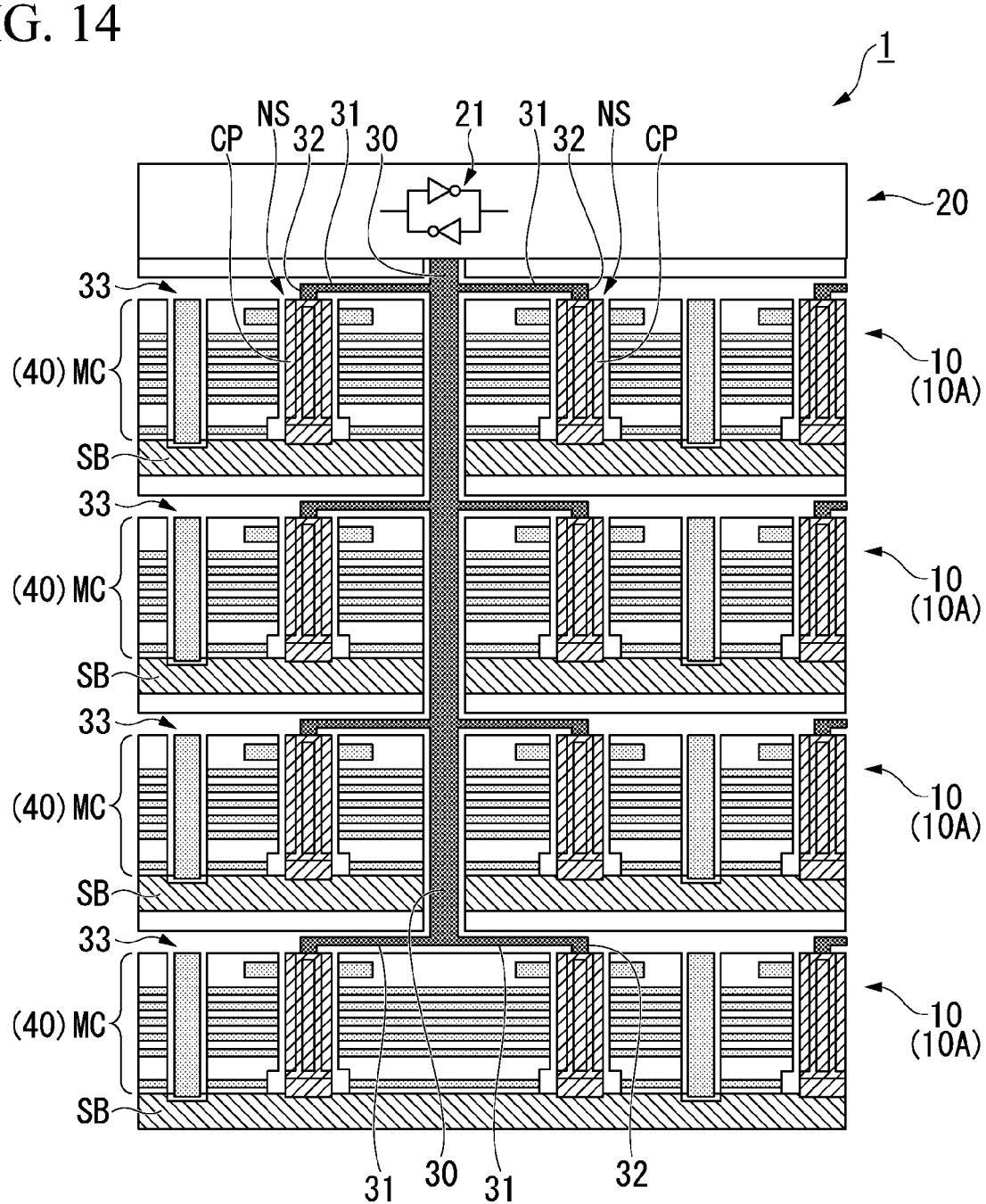
FIG. 14 is a cross-sectional view showing another example of a configuration of the semiconductor device.
Figure 15:
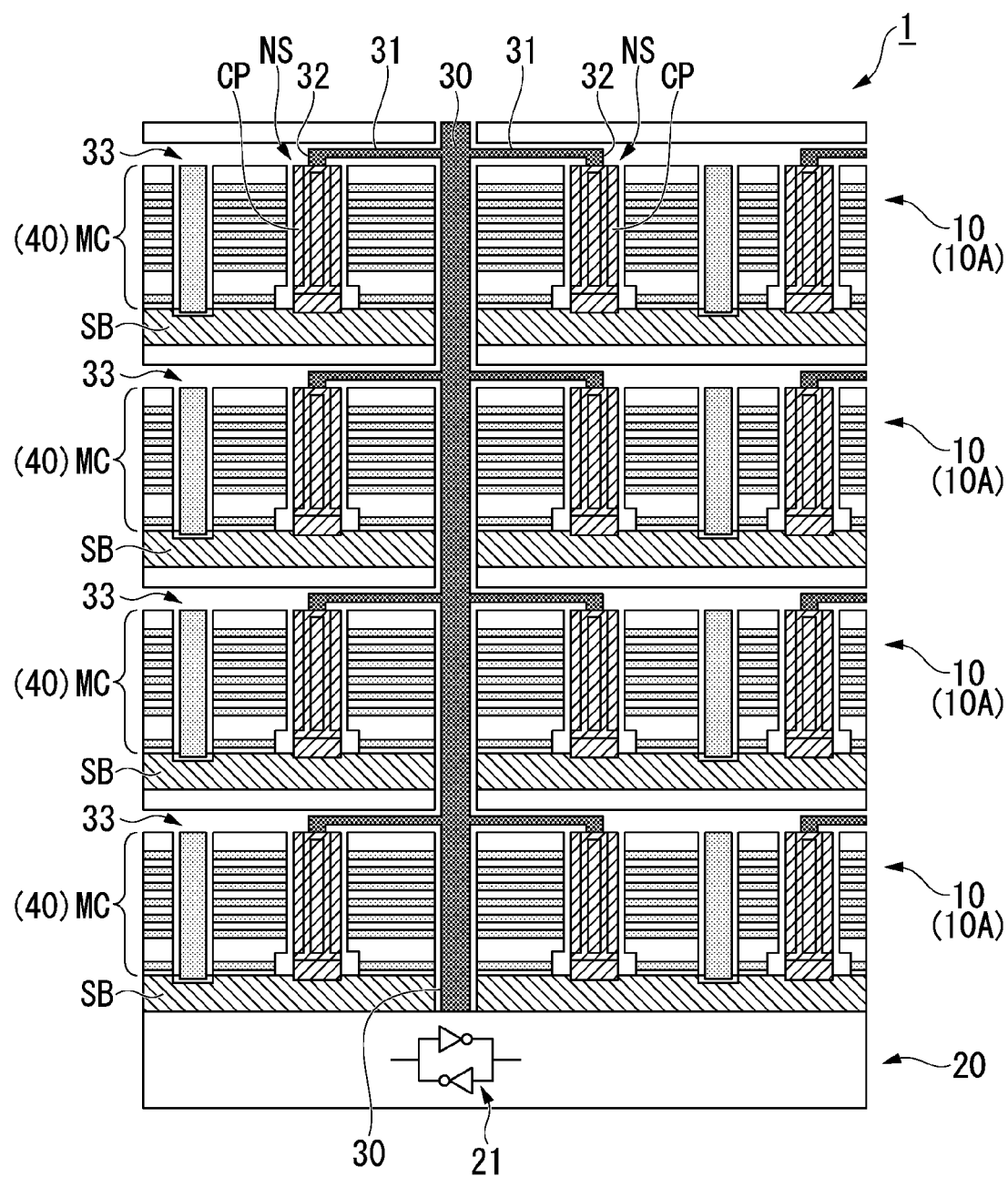
FIG. 15 is a cross-sectional view showing another example of a configuration of the semiconductor device.
Figure 16:
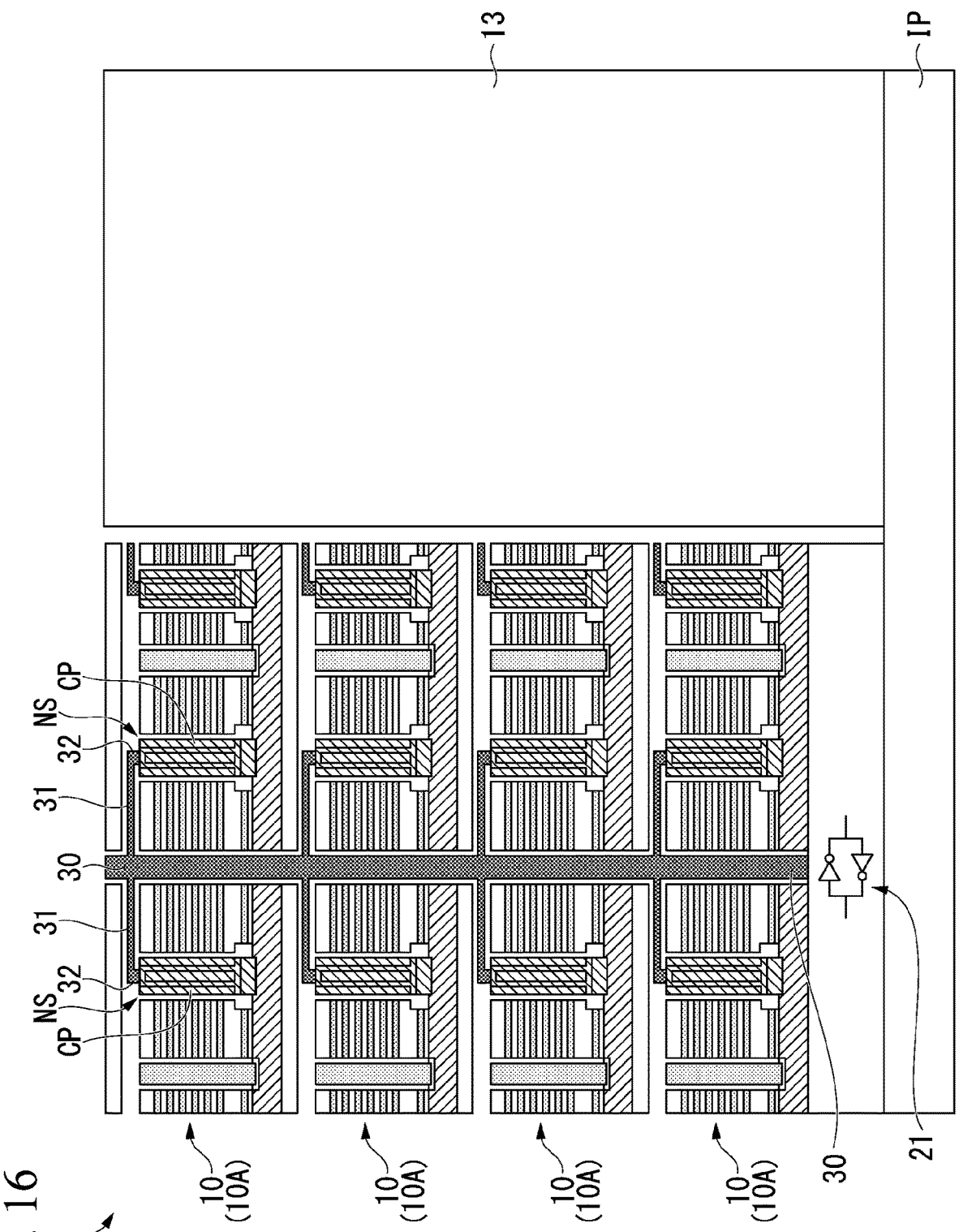
FIG. 16 is a cross-sectional view showing another example of a configuration of the semiconductor device.

For example, the foregoing semiconductor device 1 can have configurations as shown in FIGS. 14 to 16.

Specifically, in the semiconductor device 1 shown in FIG. 14, the chip laminate 10A having the plurality of memory semiconductor chips 10 laminated in the thickness direction has a configuration in which the TSV 30 is electrically connected to the plurality of NAND cell strings NS of the memory semiconductor chip 10 positioned in the lowermost layer through the bit wiring layers 31 and the contact plugs 32 without penetrating the plurality of memory cells MC of the memory semiconductor chip 10 positioned in the lowermost layer in the thickness direction.

On the other hand, the semiconductor device 1 shown in FIG. 15 has a configuration in which the planar buffer chip 20 is disposed below the chip laminate 10A having the plurality of memory semiconductor chips 10 laminated in the thickness direction and the plurality of memory semiconductor chips 10 and the planar buffer chip 20 are electrically connected to each other through the TSV 30 penetrating these in the thickness direction.

On the other hand, the semiconductor device 1 shown in FIG. 16 has a configuration in which the memory cell array 40 constituted of the chip laminate 10A shown in FIG. 15 and the control circuit 13 controlling this memory cell array 40 are mounted on an interposer IP and the memory cell array 40 and the control circuit 13 are electrically connected to each other through this interposer IP.

In each of the foregoing embodiments, an example in which the memory semiconductor chip 10 and the planar buffer chip 20 are connected to each other through the TSV 30 has been described. However, the present invention is not limited thereto, and they may be connected to each other using a different electrical connection structure such as a bump.

In addition, in each of the foregoing embodiments, an example in which the semiconductor device 1 (1a) is a flash memory device has been described. However, the present invention is not limited thereto, and it may be applied to other semiconductor memories.

In addition, in each of the foregoing embodiments, an example in which the planar buffer chip 20 is disposed on a side above the memory semiconductor chip 10 has been described. However, the present invention is not limited thereto, and it may be disposed on a side below the memory semiconductor chip 10 or the memory semiconductor chip 10 may be disposed above and below the planar buffer chip 20.

In addition, in the foregoing second embodiment, an example in which the buffer decoder part 50 is disposed in another decoder 10B different from the planar buffer chip 20 has been described. However, it may be disposed on the planar buffer chip 20 together with the buffer circuit 21.

In addition, without providing the buffer decoder part 50, for example, one buffer circuit 21 may be connected to one NAND cell string NS through the TSV 30.

Third Embodiment

Figure 17:
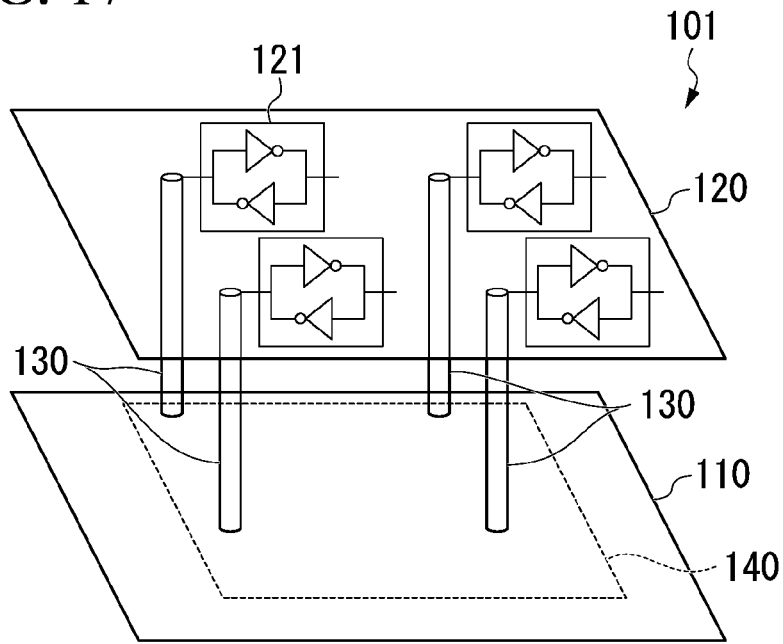
FIG. 17 is a configuration view showing an example of a semiconductor device according to a third embodiment.

FIG. 17 is a configuration view showing an example of a semiconductor device 101 according to a third embodiment.

As shown in FIG. 17, the semiconductor device 101 is, for example, a NAND-type flash memory device and includes a memory semiconductor chip 110, a planar buffer chip 120, and TSV (Through-Silicon Via) 130.

The memory semiconductor chip 110 is a semiconductor chip provided with a memory cell array 140 including a plurality of memory cells (for example, flash memory cells)

MC. The memory cell array 140 is, for example, a three-dimensional (3D) NAND-type flash memory and has a configuration obtained by laminating semiconductor chips (memory semiconductor chips) including the plurality of memory cells MC in a thickness direction. A detailed configuration of the memory cell array 140 will be described below.

The planar buffer chip 120 is a semiconductor chip provided with a plurality of buffer circuits 121 in accordance with the number of bit lines (reading lines) of the memory cell MC. The buffer circuit 121 is a circuit holding data read from the memory cell MC and data written in the memory cell MC. The buffer circuit 121 outputs held data as readout data at the time of reading. The buffer circuit 121 outputs held data as write data to the memory cell MC at the time of writing.

The TSV 130 (an example of an electrical connection structure) is a bumpless penetration electrode penetrating the memory semiconductor chip 110 and the planar buffer chip 120 in a thickness direction and that connects the memory semiconductor chip 110 to the planar buffer chip 120 using a conductor. The TSV 130 electrically connects the bit line of the memory cell MC and the buffer circuit 121 to each other in the thickness direction of the memory semiconductor chip 110 and the planar buffer chip 120.

Figure 18:
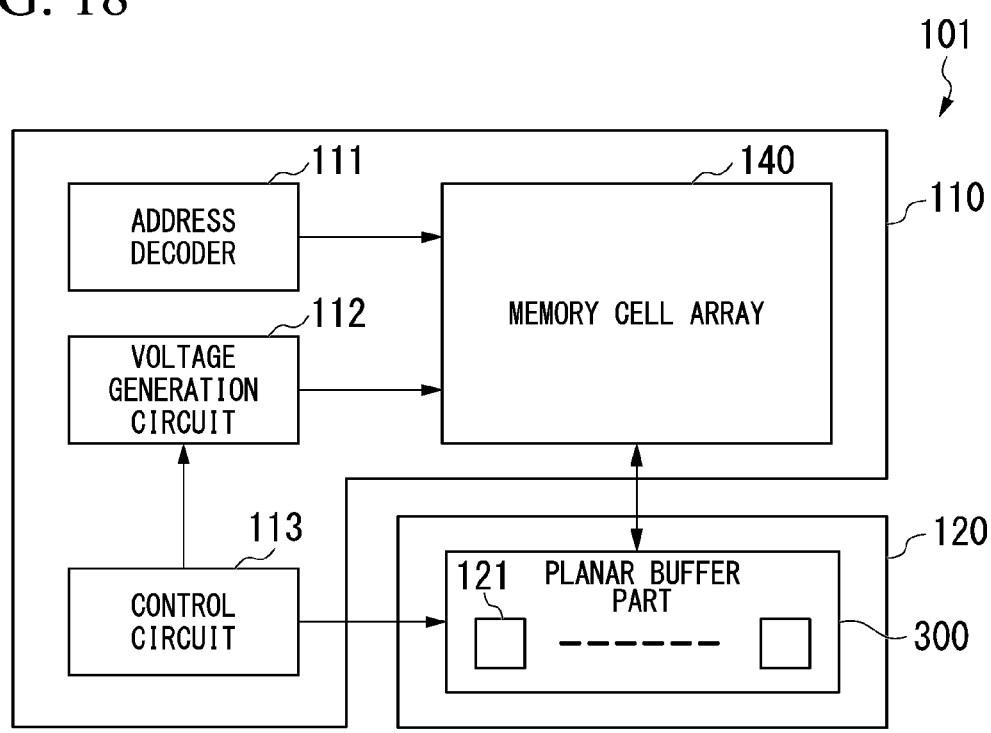
FIG. 18 is a functional block diagram showing an example of the semiconductor device according to the third embodiment.

FIG. 18 is a functional block diagram showing an example of the semiconductor device 101 according to the present embodiment. As shown in FIG. 18, the semiconductor device 101 includes an address decoder 111, a voltage generation circuit 112, a control circuit 113, a planar buffer part 300, and the memory cell array 140.

The address decoder 111 decodes input address information and outputs a control signal for selecting a memory cell MC of the memory cell array 140.

The voltage generation circuit 112 generates an erase voltage necessary for erasing data and a write voltage necessary for writing data and supplies the generated erase voltage and write voltage to the memory cell array 140 that is a flash memory.

The control circuit 113 is a logic circuit for controlling the semiconductor device 101 in response to an input from outside. The control circuit 113 controls, for example, reading data from the memory cell array 140, erasing data of the memory cell array 140, and writing data to the memory cell array 140.

In order to collectively read or write data of a predetermined data length (bit width), the planar buffer part 300 includes the buffer circuits 121 in accordance with the predetermined data length (bit width). In the present embodiment, data having a predetermined data length (bit width) is defined as "a page", and the planar buffer part 300 retains page data.

The buffer circuit 121 according to the present embodiment is connected to the bit line of the memory cell array 140 that is drawn out in the thickness direction through the TSV 130, and a plurality of buffer circuits 121 are arranged two-dimensionally on a planar shape on a plane of the planar buffer chip 120.

Next, with reference to FIGS. 19 to 22, a configuration of the memory cell array 140 according to the present embodiment will be described.

Figure 19:
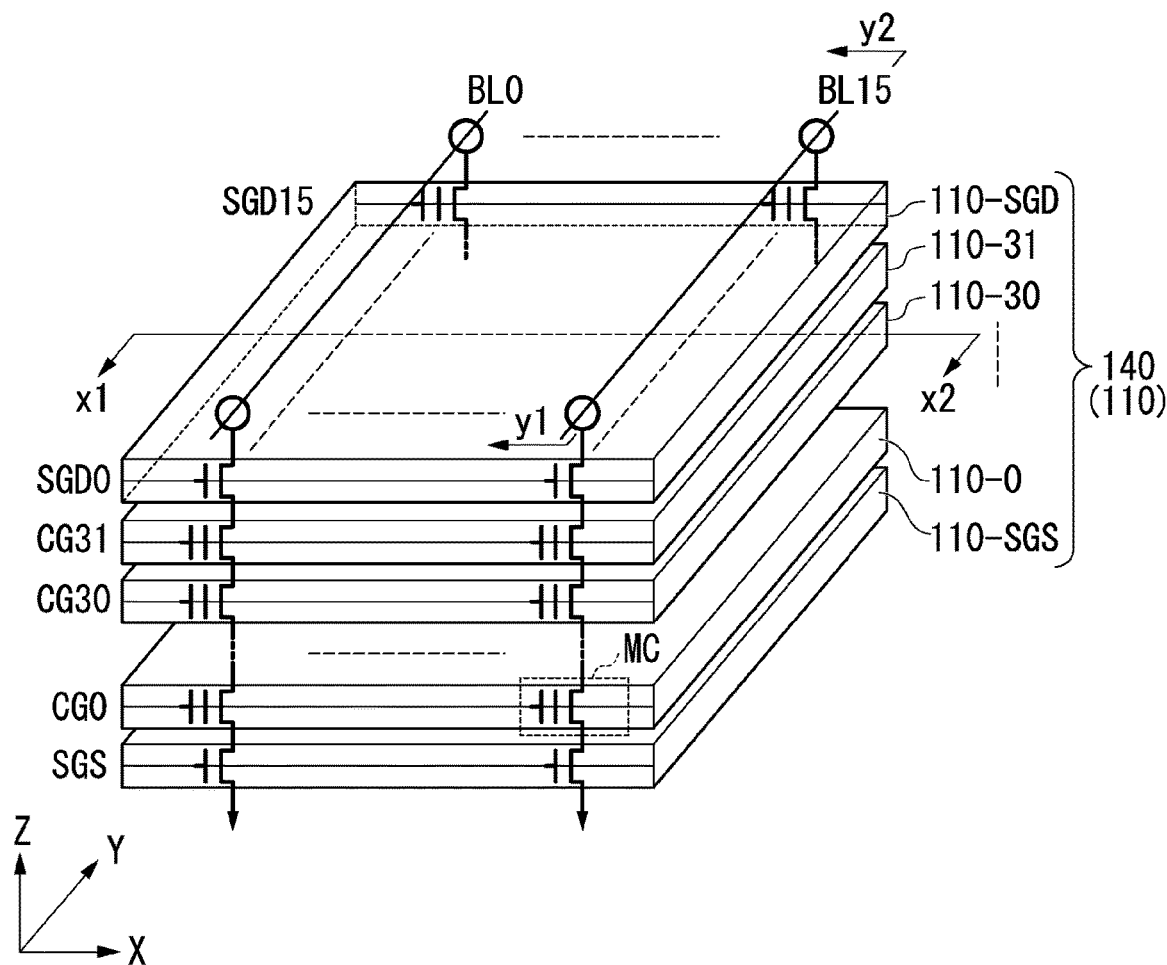
FIG. 19 is a configuration view showing an example of a memory cell array according to the third embodiment.

FIG. 19 is a configuration view showing an example of the memory cell array 140 according to the present embodiment.

As shown in FIG. 19, the memory cell array 140 includes a plurality of gate plate electrodes (110-SGS, 110-0, (ellipsis), 110-30, 10-31, and 110-SGD) laminated in the thickness direction (Z axis direction) of the memory semiconductor chip 110.

The plurality of gate plate electrodes (110-SGS, 110-0, . . . , 110-30, 110-31, 110-SGD) is an example of a three-dimensional semiconductor chip having a plurality of plate electrodes.

In FIG. 19, the direction of the cell gate signal lines (CG0 to CG31) of the memory cell array 140 is defined as an X-axis direction, and a bit line direction is defined as a Y-axis direction.

The plate surface of the gate plate electrode (110-SGS, 110-0, . . . , 110-30, 110-31, 110-SGD) is defined as an XY plane, and a thickness direction is described as a Z-axis direction.

The whole of a plurality of gate plate electrodes (110-SGS, 110-0, . . . , 110-30, 110-31, 110-SGD) constitutes the memory semiconductor chip 110.

Figure 20:
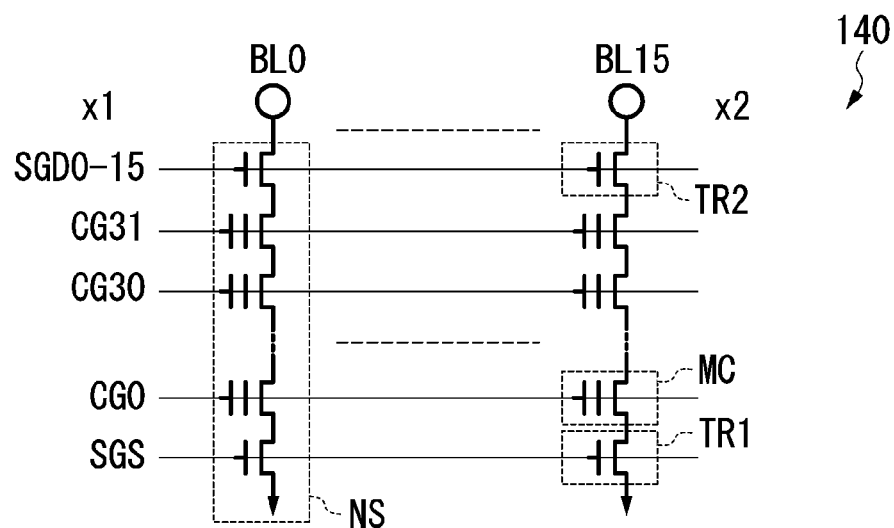
FIG. 20 is a view showing a configuration example of a memory cell array in an x1-x2 direction according to the third embodiment.

FIG. 20 is a view showing a configuration example of the memory cell array 140 in an x1-x2 direction shown in FIG. 19.

As shown in FIG. 20, the memory cell array 140 includes a NAND string NS in which a plurality of memory cells MC and selection transistors (TR1 and TR2) are connected together in series.

In the NAND string NS, for example, a grounding selection transistor TR1, thirty-two memory cells MC, and the data selection transistor TR2 are connected together in series between a bit lines (BL0-BL15) and a ground (GND) line.

The grounding selection transistor TR1 is an N-type metal-oxide-semiconductor field-effect transistor (NMOS transistor (N-type MOSFET)) disposed between the 32 memory cells MC and the GND line. An SGS signal line is connected to the gate terminal of the grounding selection transistor TR1, and the grounding selection transistor TR1 is controlled by SGS signals.

The data selection transistor TR2 is an NMOS transistor disposed between the bit lines and the 32 memory cells MC. Any of signal lines SGD0-SGD15 is connected to the gate terminals of the data selection transistor TR2, and the data selection transistor TR2 is controlled by any signal from SGD0 signal to SGD15 signal.

The 32 memory cells MC are connected in series between the grounding selection transistor TR1 and the data selection transistor TR2. Cell gate signal lines (CG0 to CG31) are connected to each gate terminals.

Each connection between the grounding selection transistor TR1, the 32 memory cells MC, and the data selection transistor TR2 is made in a thick direction (Z-axis direction) so as to penetrate through the plurality of gate plate electrodes (110-SGS, 110-0, (ellipsis), 110-30, 110-31, and 110-SGD) by cell pillars (penetration electrodes) CP which are penetration electrodes.

The SGD0 to SGD15 signals, the SGS signal, and the CG0 to CG31 signals are generated by the address decoder 111 and the control circuit 113 described above.

Figure 21:
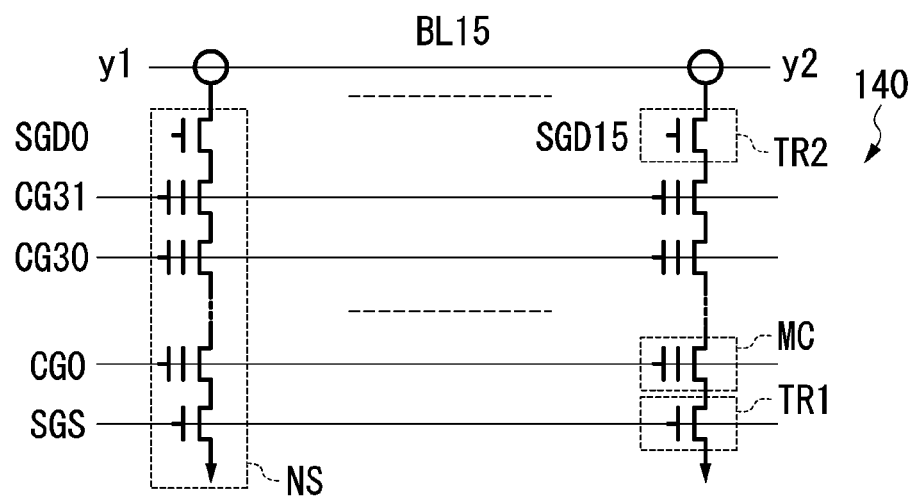
FIG. 21 is a view showing a configuration example of a memory cell array in a y1-y2 direction according to the third embodiment.

FIG. 21 is a view showing a configuration example of the memory cell array 140 in a y1-y2 direction shown in FIG. 19.

As shown in FIG. 21, similarly to the example shown in FIG. 20, the memory cell array 140 includes a NAND string NS, in which memory cells MC and selection transistors (TR1, TR2) are connected together in series.

In the example shown in FIG. 21, thirty-two NAND strings NS are connected to a bit line BL15. In each of the NAND-strings NS, a signal line of SGD0 to SGD15 signals is connected to a gate terminal of a data selection transistor TR2.

Figure 22:
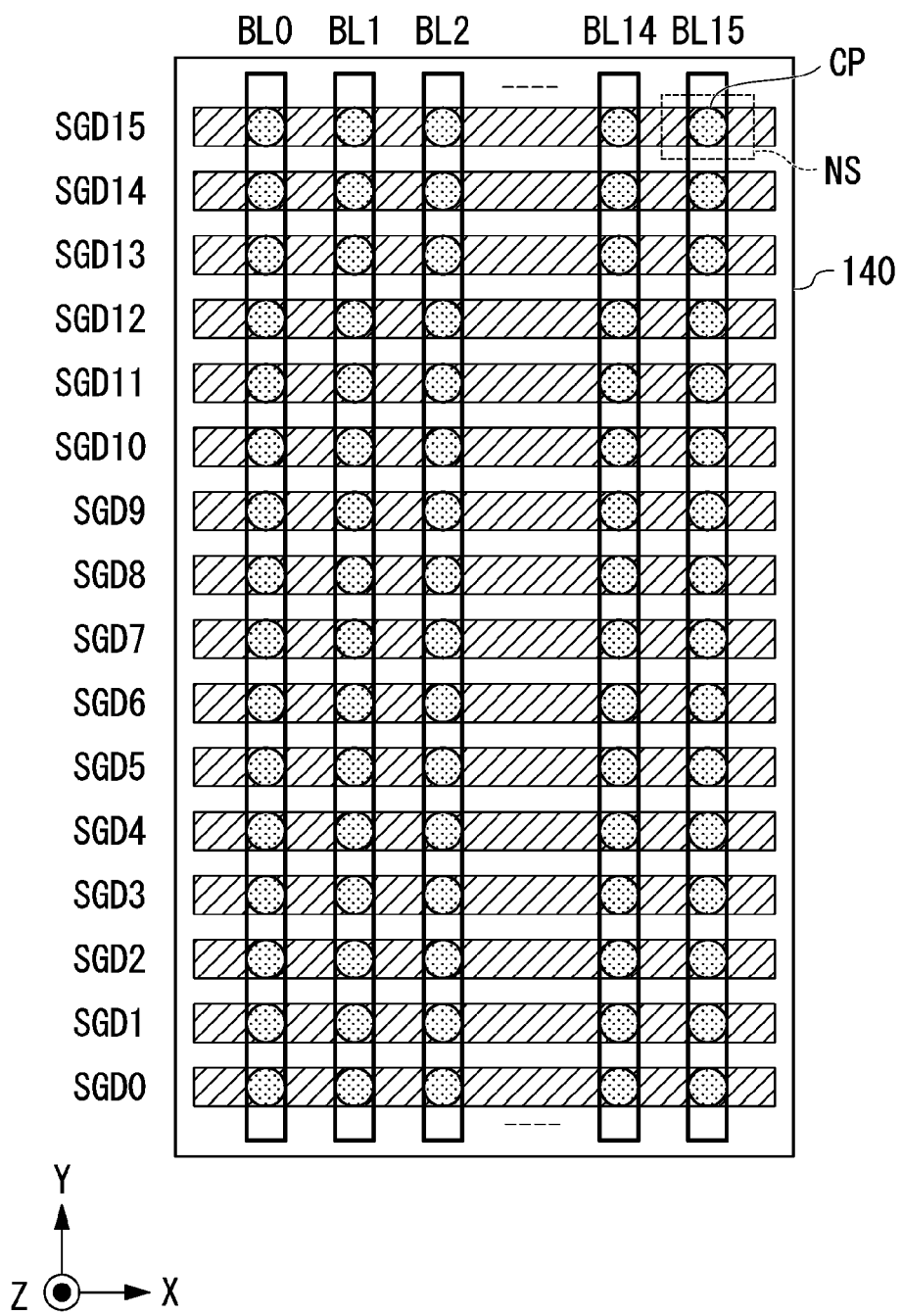
FIG. 22 is a view showing a configuration example when viewed from the top of the memory cell array according to the third embodiment.

FIG. 22 is a view showing a configuration example when viewed from the top of the memory cell array 140 in the present embodiment.

As shown in FIG. 22, a plurality of NAND strings NS are arranged in a matrix-manner. In each NAND strings NS, thirty-two memory cells MC are connected by a cell pillar CP that penetrates through a plurality of gate plate electrodes (110-SGS, 110-0, . . . , 110-30, 110-31, 110-SGD) laminated in a thickness direction (Z-axis direction).

Figure 23:
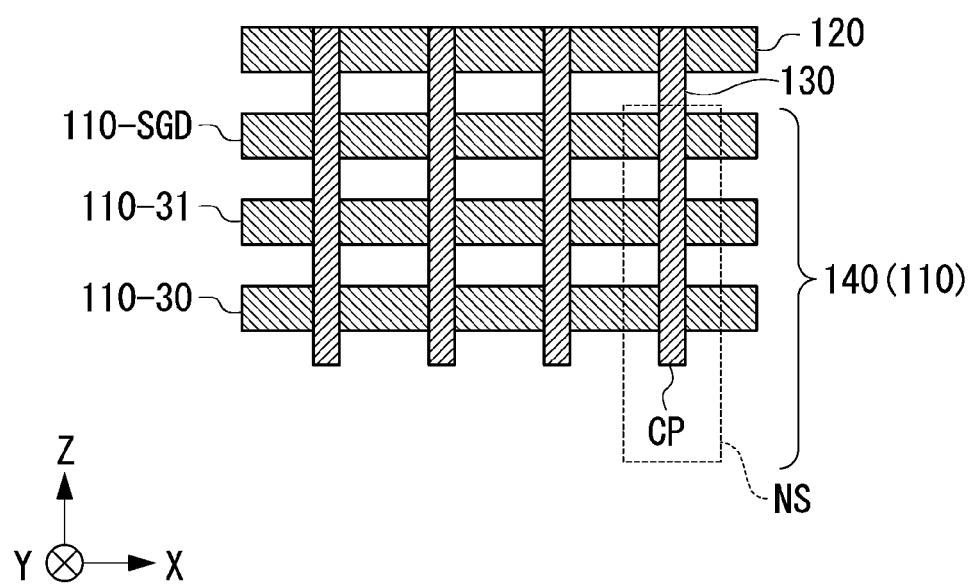
FIG. 23 is a cross-sectional view showing an example of connection between a memory semiconductor chip and a planar buffer chip according to the third embodiment.

The plurality of NAND strings NS are connected for each bit lines (BL0 to BL15) and are connected to one buffer circuit 121 described above for each bit line. FIG. 23 is a cross-sectional view showing a connection example between the memory semiconductor chip 110 and the planar buffer chip 120 in the present embodiment.

As shown in FIG. 23, the memory semiconductor chip 110 (memory cell array 140) and the planar buffer chip 120 are electrically connected by the TSV 130 that penetrates through the planar buffer chip 120.

The memory cell MC and the selection transistor (TR1, TR2) of the NAND string NS are electrically connected by the cell pillar CP that penetrates through each gate plate electrode (110-SGS, 110-0, . . . , 110-30, 110-31, 110-SGD).

In this way, the memory cell array 140 in the present embodiment is a three-dimensional flash memory in which the memory cells MC are connected together in the thickness direction by the cell pillar CP.

Next, with reference to the drawings, operation of the semiconductor device 101 according to the present embodiment will be described.

In FIG. 18 described above, in reading out data from the semiconductor device 101, when address information and, for example, a data readout command are input to the semiconductor device 101, first, the address decoder 111 generates the SGD0 to SGD15 signals, the SGS signal, and the CG0 to CG31 signals for selecting a memory cell MC to be read out on the basis of the input address information.

Specifically, the address decoder 111 selects the NAND string NS by allowing one of the SGD0 to SGD15 signals to be in a high state and the rest of the signals to be in a low state. The address decoder 111 selects one memory cell MC of the selected NAND string NS by allowing one of the CG0 to CG31 signals to be in a low state and the rest of the signals to be in a high state.

From the selected memory cell MC, "0" or "1" can be read out depending on whether or not a current flows in an OFF state in which the gate terminal is in the low state. The "0" or "1" data held by the memory cell MC is input to the buffer circuit 121 via the bit line and the TSV 130 and is held by the buffer circuit 121. Here, data of a predetermined data length (bit width) is read out in parallel from the memory cell array 140 and is held in the planar buffer part 300.

In response to the data readout command, the control circuit 113 allows the planar buffer part 300 to hold the readout data and sequentially output the held readout data to the outside.

In writing data in the semiconductor device 101, when address information, for example, a data writing command, and write data are input to the semiconductor device 101, the control circuit 113 allows the planar buffer part 300 to hold the write data. Then, the address decoder 111 generates the SGD0 to SGD15 signals, the SGS signal, and the CG0 to CG31 signals for selecting the memory cell MC to be read out on the basis of the input address information, and the control circuit 113 writes data of a predetermined data length (bit width) in parallel by applying a write voltage to the memory cell array 140 from the voltage generation circuit 112.

Figure 24:
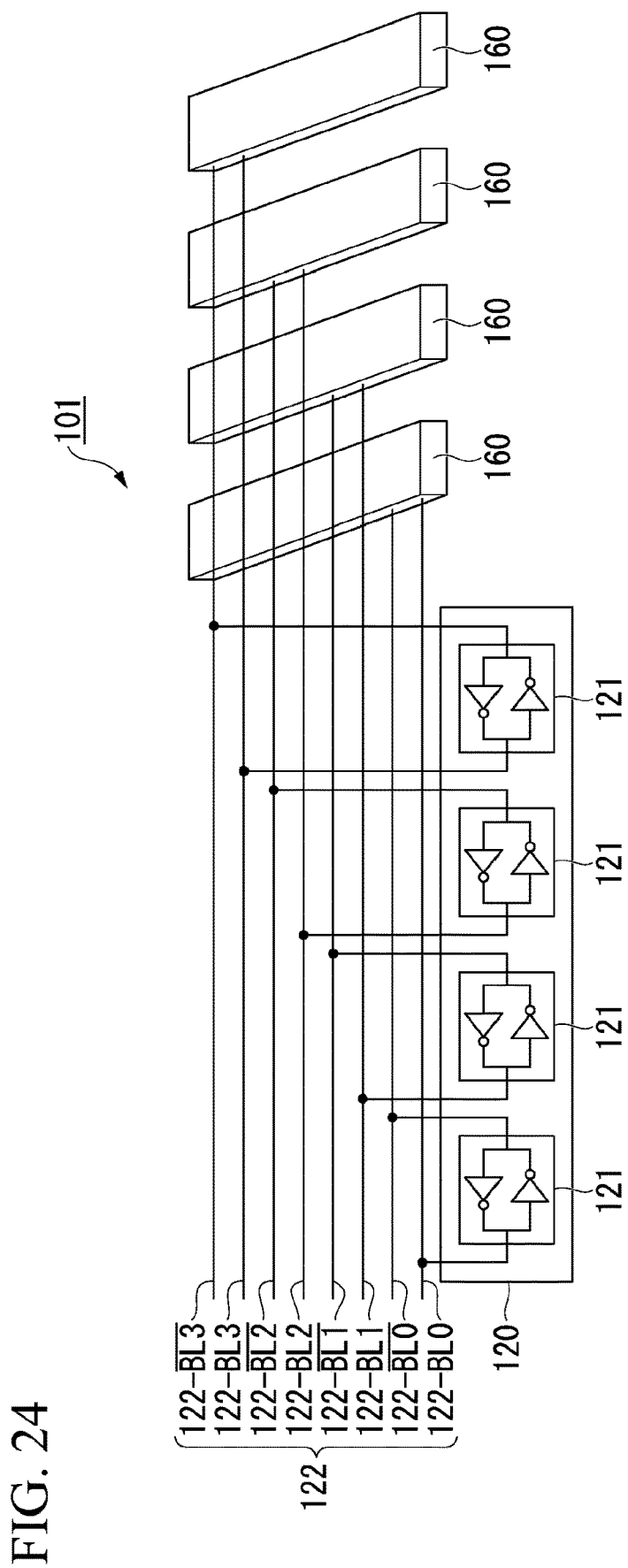
FIG. 24 is a configuration view showing an example of connection between buffer circuits included in the planar buffer chip according to the third embodiment and sense amplifiers.

FIG. 24 is a configuration view showing an example of connection between the buffer circuits 121 included in the planar buffer chip 120 and sense amplifiers 160 according to the present embodiment.

As shown in FIG. 24, the plurality of buffer circuits 121 included in the planar buffer chip 120 are electrically connected to the sense amplifiers 160 through a plurality of bit wiring layers 122 (122_BL0, 122_/BL0, 122_BL1, 122_/BL1, 122_BL2, 122_/BL2, 122_BL3, and 122_/BL3) provided for each pair of respective bit lines of the respective buffer circuits 121. The sense amplifiers 160 are provided in accordance with the respective buffer circuits 121 and detect and amplify data output from each of the buffer circuits 121. In FIG. 23, the semiconductor device 101 comprising four bit wiring layers 122 is shown as an example.

Figure 25:
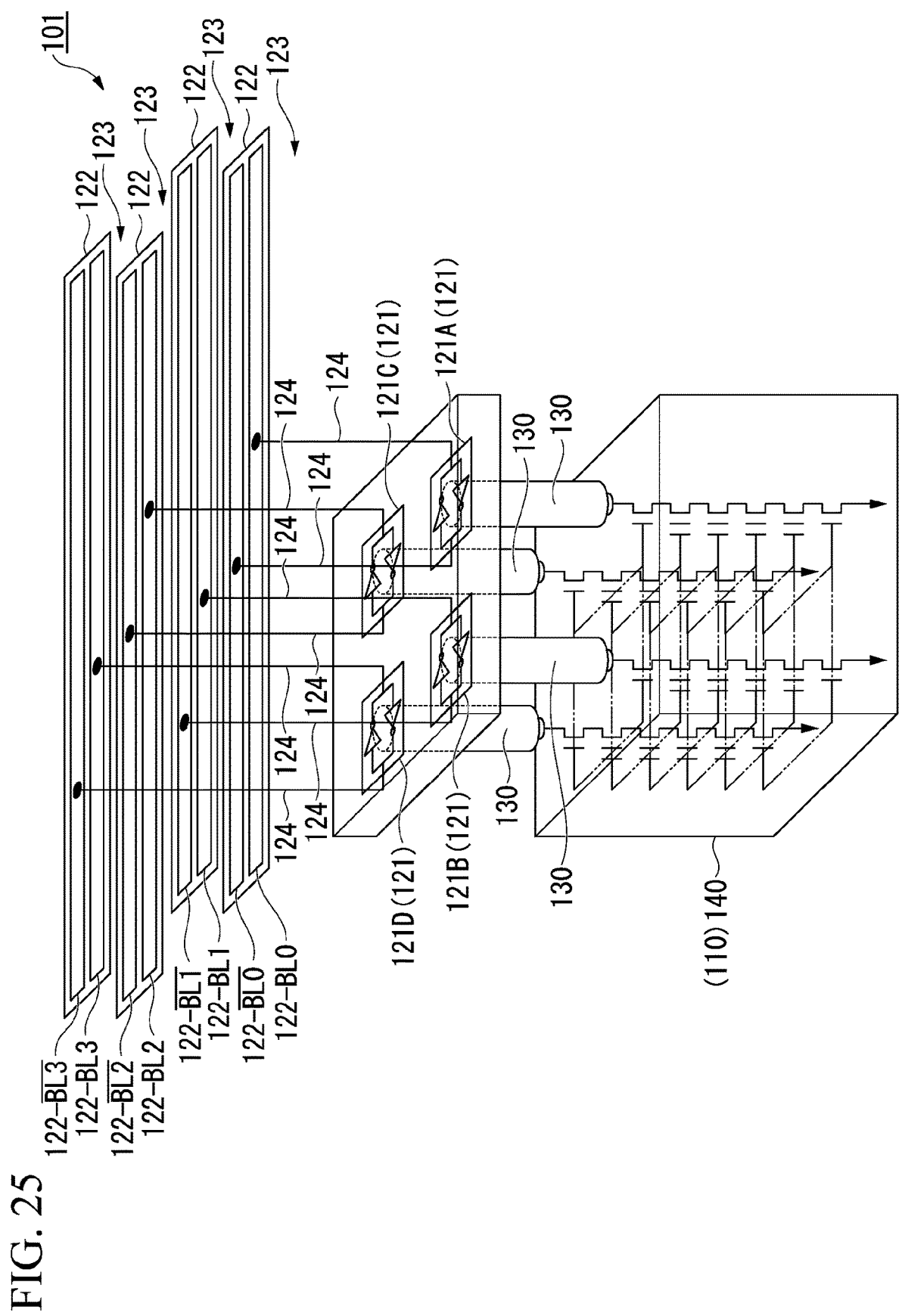
FIG. 25 is a view showing an example of a configuration of the semiconductor device in which four bit-wiring-layers are provided on the planar buffer chip according to the third embodiment.

In addition, FIG. 25 is a view showing an example of a configuration of the semiconductor device 101 in which four bit wiring layers 122 are provided on the planar buffer chip 120 according to the present embodiment.

As shown in FIG. 25, the buffer circuit 121 according to the present embodiment is connected so as to form the bit lines of the memory cell array 140 drawn out in the thickness direction through the TSV 130, and a plurality of buffer circuits 121 are arranged two-dimensionally on a plane of the planar buffer chip 120.

On the planar buffer chip 120, the bit wiring layers 122 provided for each pair of respective bit lines of the buffer circuits 121 are laminated and disposed through interlayer insulating layers 123. In addition, a pair of respective bit lines of the buffer circuits 121 and the bit wiring layers 122 corresponding to the respective buffer circuits 121 are electrically connected to each other through contact plugs 124 penetrating the interlayer insulating layers 123 in the thickness direction. In FIG. 25, the interlayer insulating layers 123 are shown as spaces.

FIG. 25 shows an example of a configuration in which four bit wiring layers 122 (122_BL0, 122_/BL0, 122_BL1, 122_/BL1, 122_BL2, 122_/BL2, 122_BL3, and 122_/BL3) are laminated and disposed on the planar buffer chip 20 with respect to the four buffer circuits 121 (which will hereinafter be distinguished as buffer circuits 121A, 121B, 121C, and 121D).

That is, the pair of bit wiring layers 122_BL0 and 122_/BL0 in the lowermost layer (first layer) and a pair of bit lines of the buffer circuit 121A are electrically connected to each other through the pair of contact plugs 124 penetrating the interlayer insulating layers 123 in the thickness direction.

In addition, the pair of bit wiring layers 122_BL1 and 122_/BL1 in a second layer and a pair of bit lines of the buffer circuit 121B are electrically connected to each other through the pair of contact plugs 124 penetrating the interlayer insulating layers 123 in the thickness direction.

In addition, the pair of bit wiring layers 122_BL2 and 122_/BL2 in a third layer and a pair of bit lines of the buffer circuit 121C are electrically connected to each other through the pair of contact plugs 124 penetrating the interlayer insulating layers 123 in the thickness direction.

In addition, the pair of bit wiring layers 122_BL3 and 122_/BL3 in the uppermost layer (fourth layer) and a pair of bit lines of the buffer circuit 121D are electrically connected to each other through the pair of contact plugs 124 penetrating the interlayer insulating layers 123 in the thickness direction.

Figure 26:
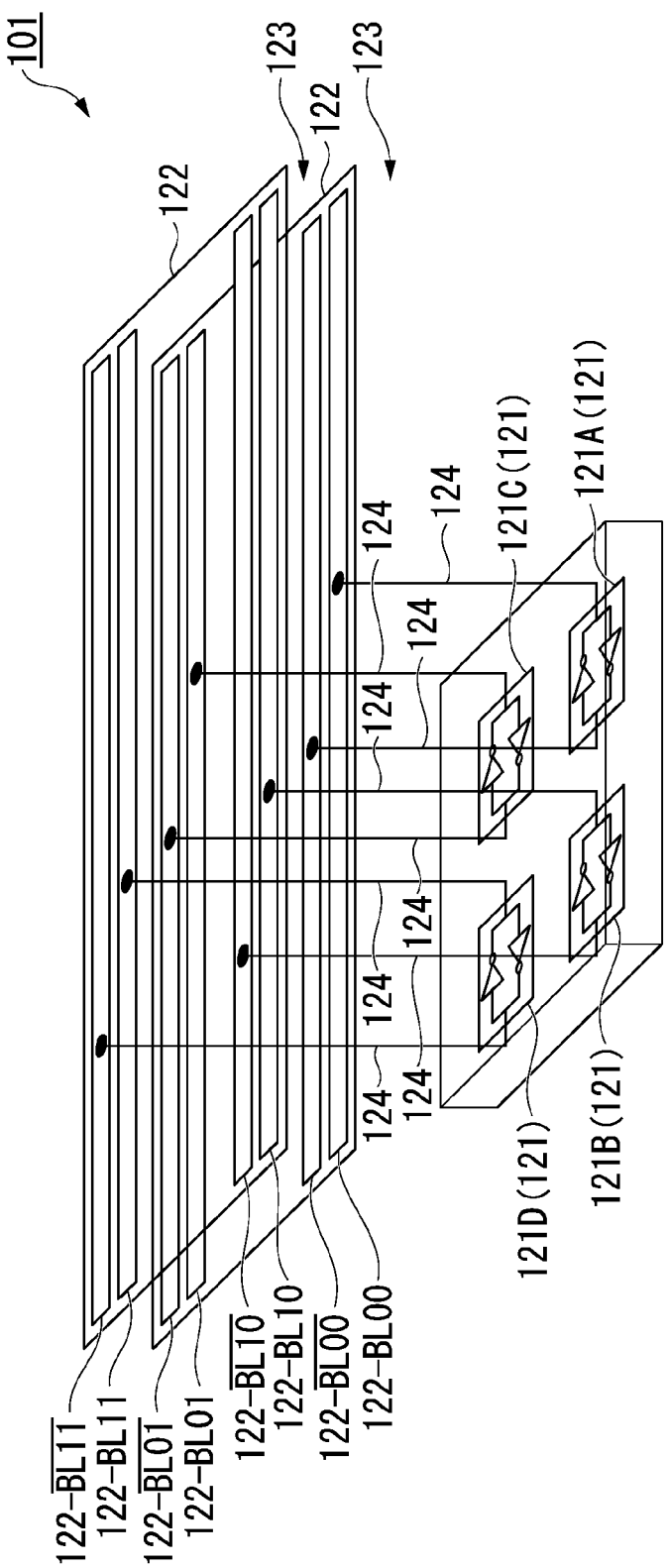
FIG. 26 is a view showing an example of a configuration in which two bit-wiring-layers are provided on the planar buffer chip according to the third embodiment.

FIG. 26 is a view showing an example of a configuration in which two bit wiring layers 122 are provided on the planar buffer chip 120 according to the present embodiment. In FIG. 26, the interlayer insulating layers 123 are shown as spaces. FIG. 26 shows an example of a configuration in which two bit wiring layers 122 (122_BL00, 122_/BL00, 122_BL01, 122_/BL01, 122_BL10, 122_/BL10, 122_BL11, and 122_/BL11) are laminated and disposed on the planar buffer chip 120 with respect to the four buffer circuits 121 (121A, 121B, 121C, and 121D).

That is, the pair of bit wiring layers 122_BL00 and 122_/BL00 in the lowermost layer (first layer) and the pair of bit lines of the buffer circuit 121A are electrically connected to each other through the pair of contact plugs 124 penetrating the interlayer insulating layers 123 in the thickness direction.

In addition, the pair of bit wiring layers 122_BL01 and 122_/BL01 which are positioned in the same layer (first layer) as the pair of bit wiring layers 122_BL00 and 122_/BL00 and the pair of bit lines of the buffer circuit 121C are electrically connected to each other through the pair of contact plugs 124 penetrating the interlayer insulating layers 123 in the thickness direction.

In addition, the pair of bit wiring layers 122_BL10 and 122_/BL10 in the uppermost layer (second layer) and the pair of bit lines of the buffer circuit 121B are electrically connected to each other through the pair of contact plugs 124 penetrating the interlayer insulating layers 123 in the thickness direction.

In addition, the pair of bit wiring layers 122_BL11 and 122_/BL11 positioned in the same layer (second layer) as the pair of bit wiring layers 122_BL10 and 122_/BL10 and the pair of bit lines of the buffer circuit 121D are electrically connected to each other through the pair of contact plugs 124 penetrating the interlayer insulating layers 123 in the thickness direction.

In the semiconductor device 101 of the present embodiment, data can be accessed in (be read and written in) the plurality of buffer circuits 121 of the planar buffer chip 120 through the plurality of bit wiring layers 122 at the same time. Therefore, in the semiconductor device 101 according to the present embodiment, an access speed can be increased.

In addition, in the semiconductor device 101 of the present embodiment, there is no need to extremely minify design rules with respect to respective bit wiring layers 122 by laminating and disposing a plurality of bit wiring layers 122 on the planar buffer chip 120.

The present embodiment is not limited to a configuration in which two or four bit wiring layers 122 are disposed as described above, and the number of laminated bit wiring layers 122 can be suitably changed. For example, a configuration in which eight bit wiring layers 122 are disposed on the planar buffer chip 120 can be adopted. In addition, the number of bit wiring layers 122 disposed in each layer can also be suitably changed in accordance with the number of plurality of buffer circuits 121 disposed on the planar buffer chip 120.

As described above, the semiconductor device 101 according to the present embodiment includes the memory semiconductor chip 110 and the TSVs 130 (electrical connection structure). The memory semiconductor chip 110 includes the plurality of memory cells MC. The planar buffer chip 120 is the semiconductor chip that comprises a plurality of the buffer circuits in accordance with the number of the memory cells MC. The buffer circuits 121 are circuits that hold data read from the memory cells MC and data written in the memory cells MC. The TSV 130 electrically connects the bit lines of the memory cells MC of the memory semiconductor chip 110 and the buffer circuit 121 of the planar buffer chip 120 to each other in the thickness direction of the memory semiconductor chip 110 and the planar buffer chip 120. In addition, the plurality of bit wiring layers 122 electrically connected to the respective bit lines of the buffer circuits 121 are laminated and disposed on the planar buffer chip 120.

Accordingly, in the semiconductor device 101 according to the present embodiment, since the buffer circuits 121 can be arranged on the planar buffer chip 120 in a two-dimensional planar shape (for example, an XY plane shape), it is possible to have parallel access (reading and writing) to more memory cells MC. Hence, in the semiconductor device 101 according to the present embodiment, the access speed can be increased.

Conventionally, for example, one-dimensional line access has been provided in a technology in the related art, but in the semiconductor device 101 according to the present embodiment, by having two-dimensional surface access, the access speed can be improved by one digit or two digits. For example, in the technology in the related art, since 16 kilobytes (KB) for one page are written in 1 millisecond (ms), a throughput thereof is 16 MB/s. In contrast, in the semiconductor device 101 according to the present embodiment, for example, parallel processing for ten pages (160 KB) can be performed, and thus the speed of throughput can be increased to 160 MB/s.

In addition, in the semiconductor device 101 according to the present embodiment, the bit lines of the memory cells MC and the buffer circuits 121 of the planar buffer chips 120 are electrically connected to each other in the thickness direction (Z axis direction) in a three-dimensional manner. Therefore, for example, as in the technology in the related art, there is no need to have connection through the wirings on the flat surfaces of the semiconductor chips, and routing of the wirings is not restricted by a wiring pitch on the flat surface. Thus, in the semiconductor device 101 according to the present embodiment, the chip sizes of the memory semiconductor chips 110 can be reduced.

In addition, in the present embodiment, the plurality of gate plate electrodes (110-SGS, 110-0, (ellipsis), 110-30, 110-31, and 110-SGD) including the memory cells MC are laminated in the thickness direction in the memory semiconductor chips 110. The TSV 130 electrically connects the plurality of laminated gate plate electrodes (110-SGS, 110-0, (ellipsis), 110-30, 110-31, and 110-SGD) and the planar buffer chip 120 to each other.

Accordingly, the semiconductor device 101 according to the present embodiment has a memory semiconductor chip 110 (memory cell arrays 140) defined in a three-dimensional manner. Therefore, the chip size of the memory semiconductor chip 110 can be further reduced, and the access speed can be further increased.

In addition, in the present embodiment, the TSV 130 is a penetration electrode penetrating the memory semiconductor chip 110 and the planar buffer chip 120 in the thickness direction and connecting the memory semiconductor chip 110 and the planar buffer chip 120 through a conductor. That is, the TSV 130 is a bumpless penetration electrode.

Accordingly, in the semiconductor device 101 according to the present embodiment, for example, compared to a case of using bumps in the technology in the related art, the pitch of the TSVs 130 can be extremely reduced, and more buffer circuits 121 can be disposed in the planar buffer chips 120. Thus, in the semiconductor device 101 according to the present embodiment, the chip sizes can be further reduced, and the access speed can be further increased.

In addition, compared to bumps in the technology in the related art, since the TSV 130 allows the semiconductor chip to be thinned, an impedance of connection can be reduced. For this reason, in the semiconductor device 101 according to the present embodiment, noise can be reduced and the access speed can be further increased.

Fourth Embodiment

Next, with reference to the drawings, a semiconductor device 101a according to a fourth embodiment will be described.

Figure 27:
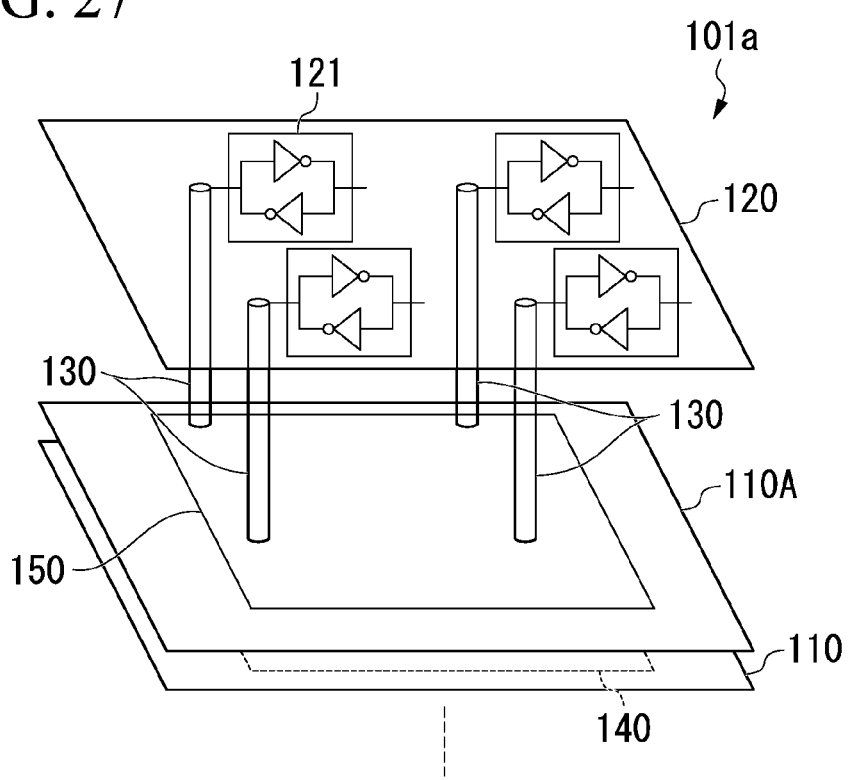
FIG. 27 is a configuration view showing an example of a semiconductor device according to a fourth embodiment.

FIG. 27 is a configuration view showing an example of the semiconductor device 101a according to the fourth embodiment.

As shown in FIG. 27, the semiconductor device 101a is NAND-type flash memory device, for example, and includes the memory semiconductor chip 110, a decoder 110A, the planar buffer chip 120, and the TSV 130. In FIG. 27, the same reference signs are applied to the same constituents as those in FIG. 17 described above, and description thereof will be omitted.

The decoder 110A includes a buffer decoder part 150 for selecting one buffer circuit 121 from bit lines of a predetermined number of memory cells. In the present embodiment, the memory semiconductor chip 110 and the planar buffer chip 120 are connected to each other through the TSV 130 via the decoder 110A. The decoder 110A is disposed inside the memory semiconductor chip 110.

Figure 28:
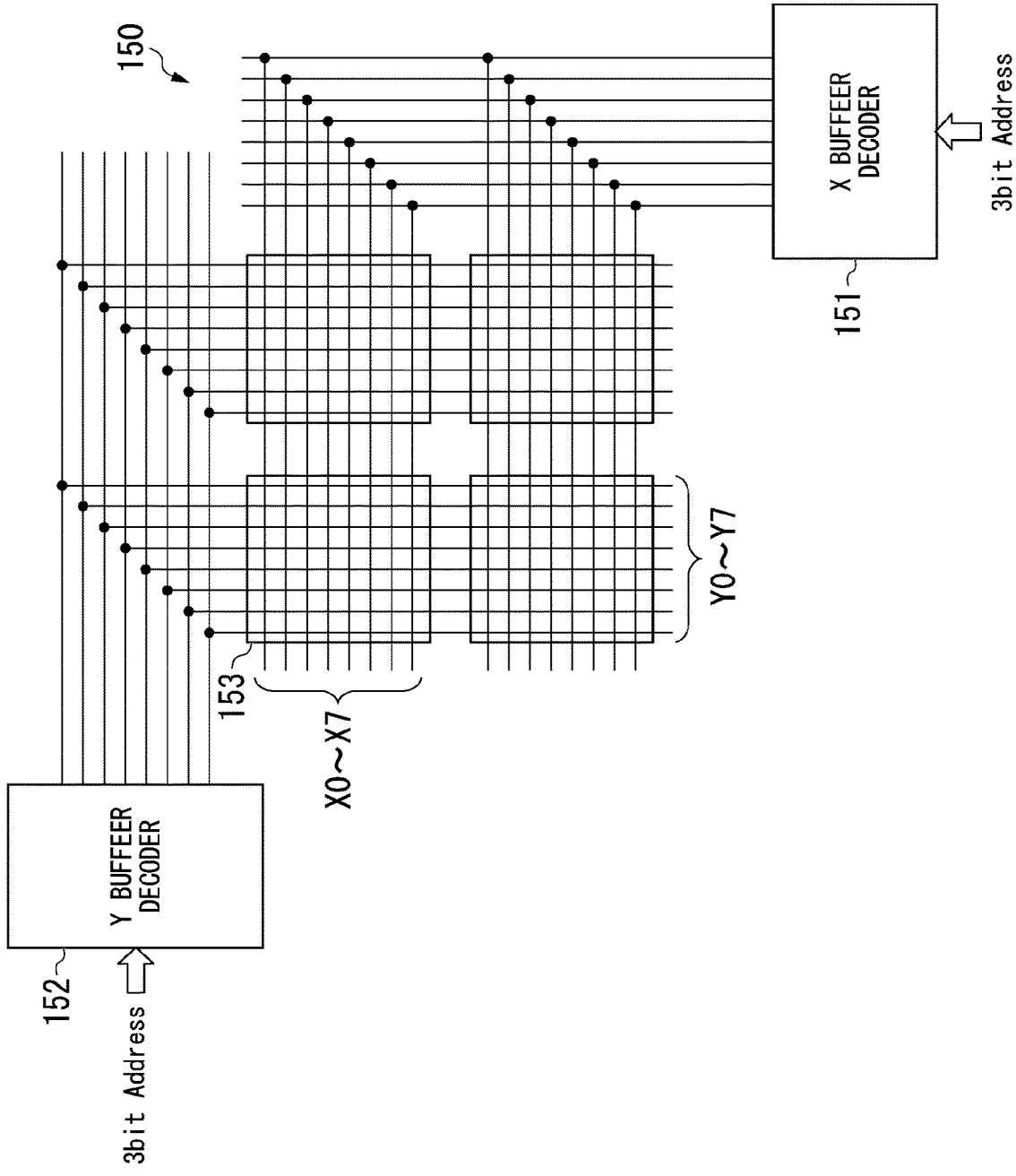
FIG. 28 is a configuration view showing an example of a buffer decoder part according to the fourth embodiment.

Next, with reference to FIGS. 28 to 30, a configuration of the buffer decoder part 150 will be described. FIG. 28 is a configuration view showing an example of the buffer decoder part 150 according to the present embodiment. As shown in FIG. 28, the buffer decoder part 150 includes an X buffer decoder 151, a Y buffer decoder 152, and a decoder switch part 153.

The X buffer decoder 151 generates selection signals X0 to X7 by decoding three bits of address information.

The Y buffer decoder 152 generates selection signals Y0 to Y7 by decoding three bits of address information different from the address information of the X buffer decoder 151.

The decoder switch part 153 selects one of 64 bit lines and connects it to the buffer circuits 121 using a combination of the selection signals X0 to X7 generated by the X buffer decoder 151 and the selection signals Y0 to Y7 generated by the Y buffer decoder 152.

In the present embodiment, one buffer circuit 121 is connected to one decoder switch part 153 through the TSV 130. In addition, one NAND string NS is connected to each of the 64 bit lines.

Next, with reference to FIGS. 29 and 30, a configuration of the decoder switch part 153 will be described.

Figure 29:
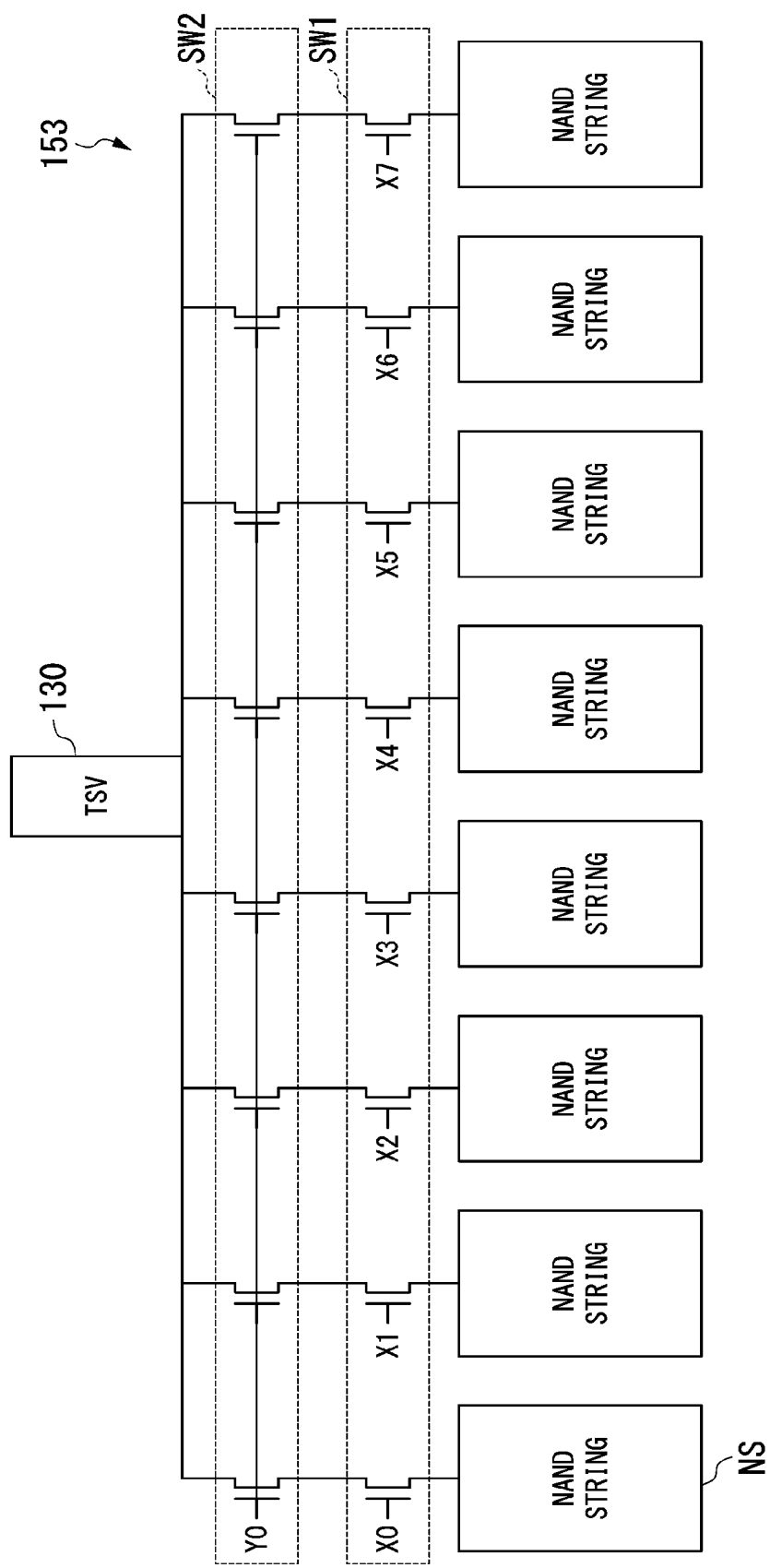
FIG. 29 is a view of a configuration of a case in which a Y0 line of a decoder switch part is selected in the fourth embodiment.

FIG. 29 is a view of a configuration of a case in which a Y0 line of the decoder switch part 153 according to the present embodiment is selected. In addition, FIG. 30 is a view of a configuration of a case in which an X0 line of the decoder switch part 153 according to the present embodiment is selected.

Figure 30:
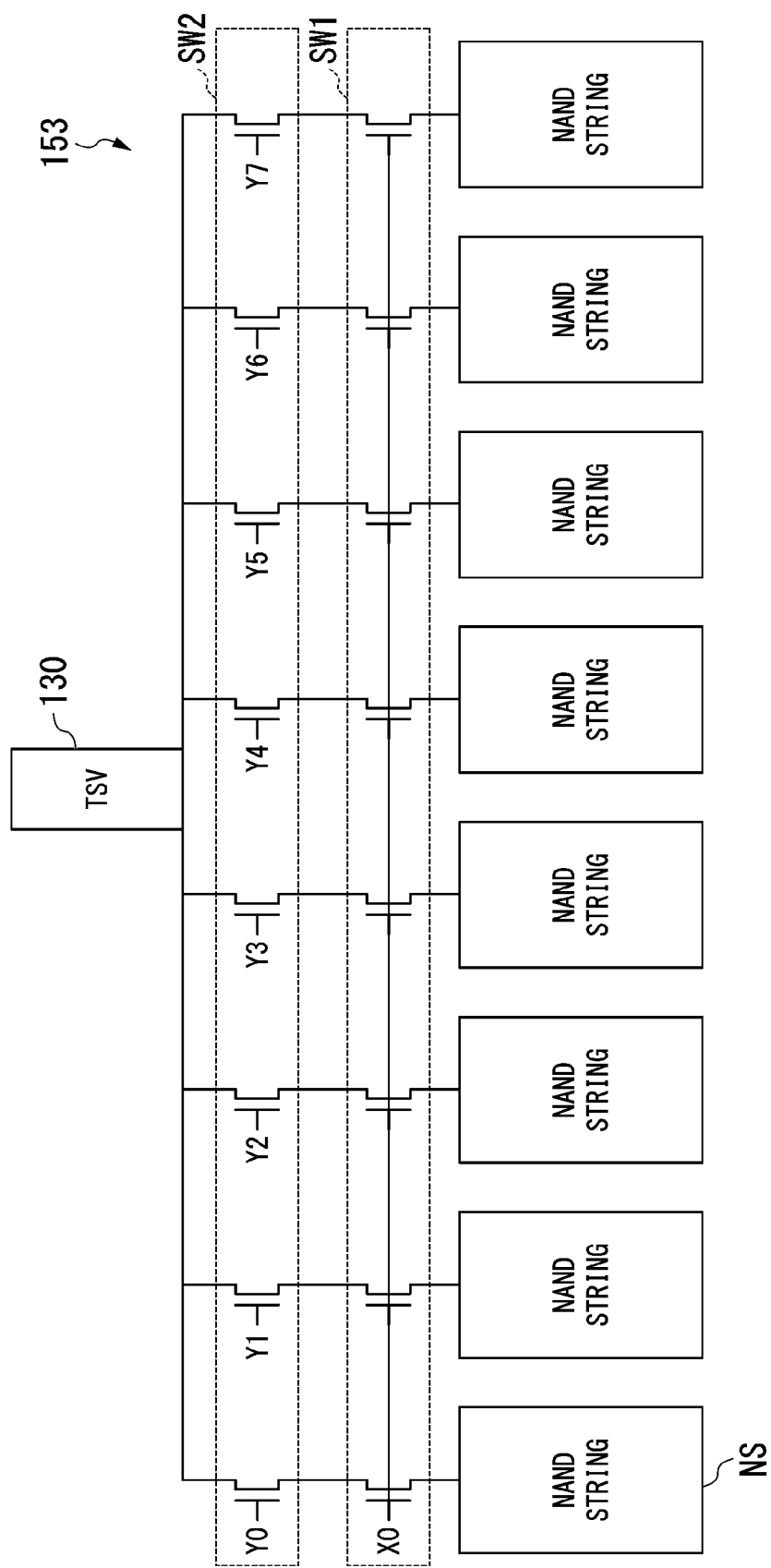
FIG. 30 is a view of a configuration of a case in which an X0 line of the decoder switch part is selected in the fourth embodiment.

As shown in FIGS. 29 and 30, the decoder switch part 153 includes a selection switch part SW1 and a selection switch part SW2.

The selection switch part SW1 is a selection switch controlled in accordance with the selection signals X0 to X7 generated by the X buffer decoder 151. In addition, the selection switch part SW2 is a selection switch controlled in accordance with the selection signals Y0 to Y7 generated by the Y buffer decoder 152.

The decoder switch part 153 selects one of the 64 NAND cell strings NS using a matrix of the selection switch part SW1 and the selection switch part SW2 and connects it to the buffer circuit 121 through the TSV 130.

The decoder switch part 153 and each of the NAND cell strings NS are electrically connected to each other using polysilicon or the like similar to that inside the NAND cell strings NS. In addition, the selection switch part SW1 and the selection switch part SW2 are disposed on the decoder 110A.

As described above, the semiconductor device 101a according to the present embodiment includes the memory semiconductor chip 110, the planar buffer chip 120, and the TSV 130 (electrical connection structure) described above and also includes the buffer decoder part 150. The buffer decoder part 150 selects one of a predetermined number (for example, 64) of bit lines of the memory cell and connects it to the buffer circuit 121.

Accordingly, the semiconductor device 101a according to the present embodiment can select one from the appropriate number of bit lines and connect the selected one bit line to the buffer circuit 121.

In the semiconductor device 101a according to the present embodiment, although illustration is omitted, similar to the foregoing semiconductor device 101, the plurality of bit wiring layers 122 electrically connected to the respective bit lines of the buffer circuits 121 can be laminated and disposed on the planar buffer chip 120.

The present invention is not limited to each of the foregoing embodiments and can be changed within a range not departing from the gist of the present invention.

For example, the above embodiments are described using an example in which the memory cell array 140 is a NAND-type memory array in which the memory cells MC are three-dimensionally arranged; however, the embodiment is not limited thereto. The present invention may be applied to a memory array in which the memory cells MC are arranged in a planar form on the memory semiconductor chip 110.

In each of the foregoing embodiments, an example in which the memory semiconductor chip 110 and the planar buffer chip 120 are connected to each other through the TSV 130 has been described. However, the present invention is not limited thereto, and they may be connected to each other using a different electrical connection structure such as a bump.

In addition, in each of the foregoing embodiments, an example in which the semiconductor device 101 (101a) is a flash memory device has been described. However, the present invention is not limited thereto, and it may be applied to other semiconductor memories.

In addition, in each of the foregoing embodiments, an example in which the planar buffer chip 120 is disposed on a side above the memory semiconductor chip 110 has been described. However, the present invention is not limited thereto, and it may be disposed on a side below the memory semiconductor chip 110 or the memory semiconductor chip 110 may be disposed above and below the planar buffer chip 120.

In addition, in the foregoing fourth embodiment, an example in which the buffer decoder part 150 is disposed in another decoder 110A different from the planar buffer chip 120 has been described. However, it may be disposed on the planar buffer chip 120 together with the buffer circuit 121.

In addition, without providing the buffer decoder part 150, for example, one buffer circuit 121 may be connected to one NAND string NS through the TSV 130.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 1, 1a Semiconductor device
10 Memory semiconductor chip
10A Chip laminate
10-SGS, 10-0, 10-30, 10-31, 10-SGD Gate plate electrode
10B Decoder
11 Address decoder
12 Voltage generation circuit
13 Control circuit
20 Planar buffer chip
21 Buffer circuit
22 Bit wiring layer
23 Interlayer insulating layer
24 Contact plug
30 TSV (penetration electrode)
31 Bit wiring layer
32 Contact plug
33 Interlayer insulating layer
40 Memory cell array
50 Buffer decoder part
51 X buffer decoder
52 Y buffer decoder
53 Decoder switch part
60 Sense amplifier
200 Planar buffer part
CP Cell pillar
MC Memory cell
NS NAND cell string
SW1, SW2 Selection switch part
TR1, TR2 Selection transistor
101, 101a Semiconductor device
110 Memory semiconductor chip
110-SGS, 110-0, 110-30, 110-31, 110-SGD Gate plate electrode
110A Decoder
111 Address decoder
112 Voltage generation circuit
113 Control circuit
120 Planar buffer chip
121 Buffer circuit
122 Bit wiring layer
123 Interlayer insulating layer
124 Contact plug
130 TSV
140 Memory cell array
150 Buffer decoder part
151 X buffer decoder
152 Y buffer decoder
153 Decoder switch part
160 Sense amplifier

What is claimed is:

1. A semiconductor device comprising:
   a memory semiconductor chip having a plurality of memory cells;
   a planar buffer chip which is a semiconductor chip that comprises a plurality of buffer circuits which hold data read from a memory cell of the plurality of memory cells, which hold data written to the memory cell and which output the held data in accordance with a number of bit lines of the plurality of memory cells;
   an electrical connection structure which electrically connects the bit lines of the memory cells of the memory semiconductor chip and bit lines of the buffer circuits of the planar buffer chip to each other in a thickness direction of the memory semiconductor chip and the planar buffer chip; and
   a plurality of bit wiring layers provided in accordance with the respective buffer circuits and electrically connected to the bit lines of the buffer circuits,
   wherein the plurality of bit wiring layers are laminated on the planar buffer chip, and
   wherein the plurality of bit wiring layers are provided on an opposite side of the planar buffer chip as the memory semiconductor chip, in the thickness direction of the planar buffer chip.

2. The semiconductor device according to claim 1, wherein, on the planar buffer chip, the bit wiring layers respectively provided for the bit lines of the buffer circuits are laminated through interlayer insulating layers.

3. The semiconductor device according to claim 1, further comprising:
   a buffer decoder part which selectively connect one of the bit lines of a predetermined number of the memory cells with one of the bit lines of the buffer circuit.

4. The semiconductor device according to claim 1, wherein, in the memory semiconductor chip, a plurality of semiconductor chips including the memory cells are laminated in the thickness direction, and
   the electrical connection structure electrically connects the laminated semiconductor tips with the planar buffer chip.

5. The semiconductor device according to claim 1, wherein the electrical connection structure includes a penetration electrode which penetrates the memory semiconductor chip and the planar buffer chip in the thickness direction and connects the memory semiconductor chip to the planar buffer chip using a conductor.

* * * * *